(12) United States Patent
Fang

(10) Patent No.: US 11,710,675 B2
(45) Date of Patent: Jul. 25, 2023

(54) PACKAGE STRUCTURE AND METHOD FOR MANUFACTURING THE SAME

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 123 days.

(21) Appl. No.: 17/177,997

(22) Filed: Feb. 17, 2021

(65) Prior Publication Data

US 2022/0262697 A1 Aug. 18, 2022

(51) Int. Cl.

| H01L 23/31 | (2006.01) |
|---|---|
| H01L 23/373 | (2006.01) |
| H01L 23/367 | (2006.01) |
| H01L 21/48 | (2006.01) |
| H01L 21/56 | (2006.01) |
| H01L 23/00 | (2006.01) |

(52) U.S. Cl.
CPC ...... *H01L 23/3142* (2013.01); *H01L 21/4882* (2013.01); *H01L 21/565* (2013.01); *H01L 23/367* (2013.01); *H01L 23/373* (2013.01); *H01L 24/13* (2013.01); *H01L 24/20* (2013.01); *H01L 2224/13026* (2013.01); *H01L 2224/2101* (2013.01); *H01L 2224/214* (2013.01); *H01L 2924/3511* (2013.01)

(58) Field of Classification Search
CPC .................................................. H01L 23/3142
See application file for complete search history.

(56) References Cited

U.S. PATENT DOCUMENTS

2018/0114740 A1* 4/2018 Liu ................... H01L 23/53238

* cited by examiner

*Primary Examiner* — William A Harriston
(74) *Attorney, Agent, or Firm* — Foley & Lardner LLP

(57) ABSTRACT

A package structure and a method for manufacturing the same are provided. The package structure includes an electronic device, a heat spreader, an intermediate layer and an encapsulant. The electronic device includes a plurality of electrical contacts. The intermediate layer is interposed between the electronic device and the heat spreader. The intermediate layer includes a sintered material. The encapsulant encapsulates the electronic device. A surface of the encapsulant is substantially coplanar with a plurality of surfaces of the electrical contacts.

14 Claims, 21 Drawing Sheets

PACKAGE STRUCTURE AND METHOD FOR MANUFACTURING THE SAME

BACKGROUND

1. Field of the Disclosure

The present disclosure relates to a package structure and a manufacturing method, and to a package structure including a heat spreader and a method for manufacturing the same.

2. Description of the Related Art

During an operation of a semiconductor package structure, the heat generated by semiconductor die or semiconductor chip may adversely affect the performance of the semiconductor package structure. Thus, a heat spreader may be needed to dissipate such heat. However, the attachment or bonding between the heat spreader and the semiconductor package structure is a critical issue. During a manufacturing process of the semiconductor package structure with the heat spreader, a semiconductor die or a semiconductor chip may be attached to a heat spreader, then a molding process may be conducted to apply an encapsulant to encapsulate the semiconductor die or the semiconductor chip. However, during the molding process, the semiconductor die or the semiconductor chip may be shifted from its predetermined position. In addition, the semiconductor package structure with the heat spreader may have a severe warpage.

SUMMARY

In some embodiments, a package structure includes an electronic device, a heat spreader, an intermediate layer and an encapsulant. The intermediate layer is interposed between the electronic device and the heat spreader. The intermediate layer includes a sintered material. The encapsulant encapsulates the electronic device.

In some embodiments, a package structure includes a first electronic device, a second electronic device, a reinforcement and a wiring structure. The reinforcement layer covers the first electronic device, the second electronic device and a gap between the first electronic device and the second electronic device. The reinforcement layer includes a sintered material. The wiring structure is electrically connected to the first electronic device and the second electronic device.

In some embodiments, a manufacturing method includes: (a) providing an intermediate layer on a heat spreader; (b) attaching at least one electronic device on the intermediate layer; and (c) sintering the intermediate layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
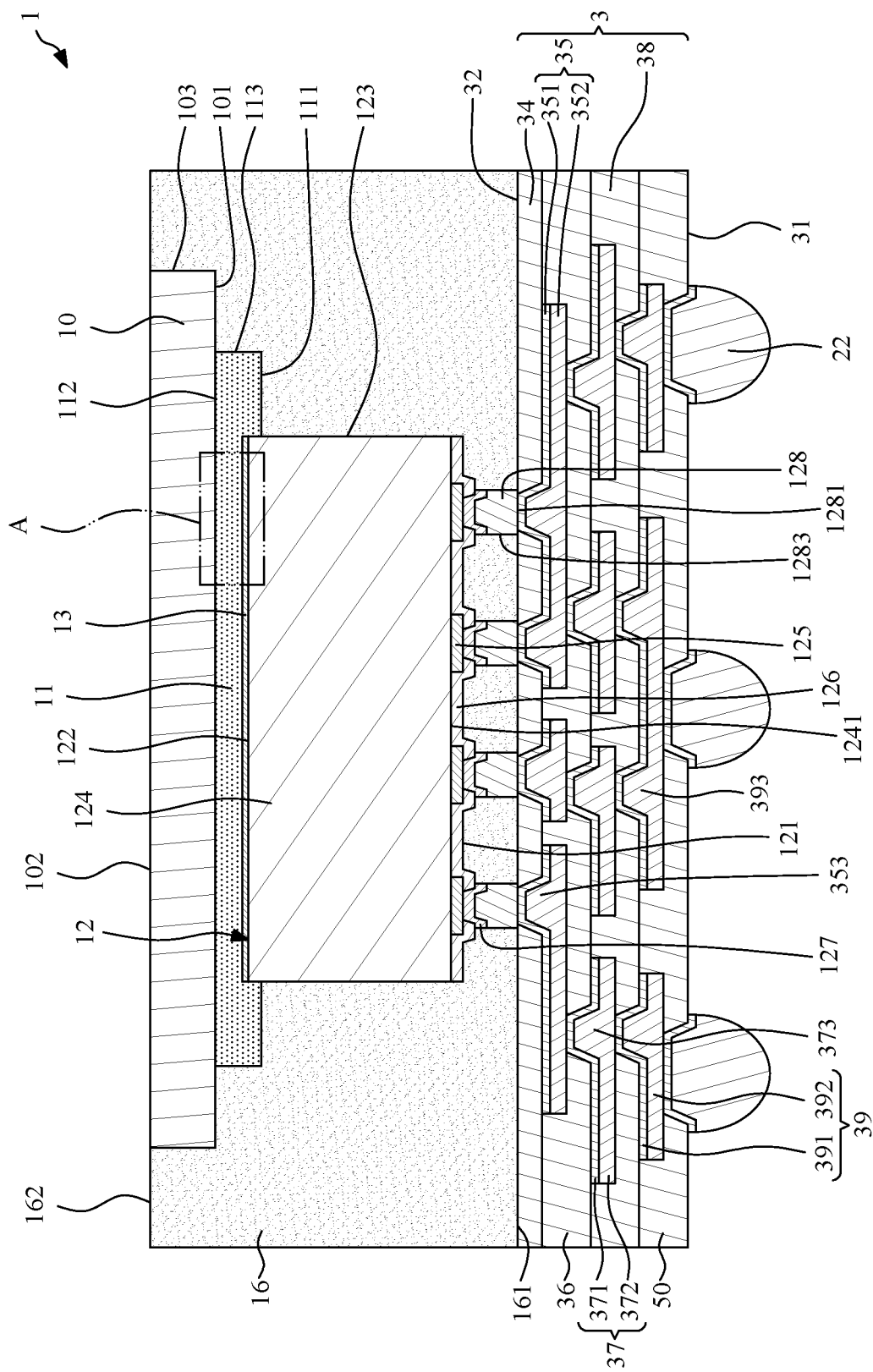
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a package structure 1 according to some embodiments of the present disclosure. The package structure 1 may include a wiring structure 3, at least one electronic device 12, a bonding promoter 13, a heat spreader 10, an intermediate layer 11, an encapsulant 16 and a plurality of external connectors 22. As shown in FIG. 1, the package structure 1 may include one electronic device 12. However, the amount(s) of the electronic device 12 is not limited in the present disclosure.

The electronic device 12 may have a first surface 121 (e.g., a bottom surface or an active surface), a second surface 122 (e.g., a top surface or a backside surface) opposite to the first surface 121, and a periphery lateral surface 123 extending between the first surface 121 and the second surface 122. The electronic device 12 may include a main body 124, a plurality of pads 125, a passivation layer 126, a plurality of under bump metallurgies (UBMs) 127, and a plurality of electrical contacts 128. A material of the main body 124 may include silicon, germanium, and/or other suitable material. The pads 125 may be disposed adjacent to or on a first surface 1241 (e.g., a bottom surface) of the main body 124. Alternatively, the pads 125 may be in proximity to, or embedded in and exposed at the first surface 121 of the electronic device 12. In some embodiments, the pads 125 may be included in a circuit layer, the material of which is aluminum, copper or an alloy or a mixture of aluminum-copper. The passivation layer 126 covers the pads 125 and the first surface 1241 of the main body 124, and defines a plurality of openings to expose a portion of each of the pads 125. The passivation layer 126 may be a solder mask (the material of which is, for example, PI), an oxide layer or a nitride layer. The UBMs 127 are disposed at the openings of the passivation layer 126, and contact the pads 125. The electrical contacts 128 are disposed on the UBMs 127. Thus, the electrical contacts 128 are disposed adjacent to the first surface 121 of the electronic device 12. The electrical contacts 128 may be input/output (I/O) contacts such as bumps, posts or pillars that stand on and connect the pads 125 through the UBMs 127. Each of the electrical contacts 128 may have a first surface 1281 (e.g., a bottom surface) and a periphery side surface 1283.

The electronic device 12 may be electrically connected to the wiring structure 3 through the electrical contacts 128. In some embodiments, each of the electrical contacts 128 may be an integral structure or a monolithic structure. A cross-section of the periphery side surface 1283 of each of the electrical contacts 128 is a substantially straight line that is substantially perpendicular to the first surface 121 of the electronic device 12. Alternatively, a curvature of a cross-section of the periphery side surface 1283 of each of the electrical contacts 128 is continuous. Further, a material of the electrical contacts 128 may include a substantially pure metal such as copper, aluminum, gold or other suitable material. That is, the electrical contacts 128 may not further include any additional material (e.g., solder material (AgSn alloy)) on the first surface 1281 thereof.

The bonding promoter 13 may be disposed on the second surface 122 of the electronic device 12. Thus, the bonding promoter 13 may be interposed between the electronic device 12 and the intermediate layer 11 so as to facilitate the bonding between the electronic device 12 and the intermediate layer 11. The bonding promoter 13 may include at least one seed layer or metal layer (e.g., copper layer, titanium layer and/or stainless steel layer). In some embodiments, the bonding promoter 13 may be a portion of the electronic device 12. In some embodiments, the bonding promoter 13 may be omitted.

The intermediate layer 11 is interposed between the electronic device 12 and the heat spreader 10, and used for bonding the electronic device 12 and the heat spreader 10. Thus, the electronic device 12 with the bonding promoter 13 may be attached or fastened to the heat spreader 10 through the intermediate layer 11. The intermediate layer 11 may include a sintered material. The intermediate layer 11 may include a thermally conductive material or a thermal interface material. In some embodiments, the intermediate layer 11 may include an adhesion layer that is cured from an adhesive material (e.g., includes a cured adhesive material such as an adhesive polymeric material). For example, the intermediate layer 11 may include epoxy and a plurality of metal (e.g., Cu or Ag) particles. A Young's modulus of the intermediate layer 11 may be greater than 0.3 GPa or greater than 8 GPa. A thermal conductivity of the intermediate layer 11 may be greater than 10 W/K or greater than 100 W/K. In some embodiments, a Young's modulus of a thermal interface material (TIM) may be less than 0.3 GPa, and a thermal conductivity of the thermal interface material (TIM) may be less than 10 W/K.

The intermediate layer 11 is in contact with the bonding promoter 13, the electronic device 12 and the heat spreader 10. As shown in FIG. 1, a portion of the electronic device 12 is embedded in the intermediate layer 11. Thus, a portion of the intermediate layer 11 is in contact with a portion of the lateral side surface 123 of the electronic device 12. For example, the bonding promoter 13 and the second surface 122 (e.g., a top surface) of the electronic device 12 are embedded in the intermediate layer 11. The intermediate layer 11 may have a first surface 111 (e.g., a bottom surface), a second surface 112 (e.g., a top surface) opposite to the first surface 111, and a periphery lateral surface 113 extending between the first surface 111 and the second surface 112. The periphery lateral surface 113 and the first surface 111 that are in contact with the encapsulant 16 may be rough, and may have a surface roughness (Ra) in a range from 1 to 10 μm.

The heat spreader 10 may be a metal plate, and may have a first surface 101 (e.g., a bottom surface), a second surface 102 (e.g., a top surface) opposite to the first surface 101, and a periphery lateral surface 103 extending between the first surface 101 and the second surface 102. The first surface 101 of the heat spreader 10 may be in contact with the second surface 112 of the intermediate layer 11. In some embodiments, the heat spreader 10 may be lid type or cavity type.

The encapsulant 16 (e.g., molding compound) may be disposed on or in contact with the wiring structure 3 and may cover and encapsulate the electronic device 12, the intermediate layer 11 and the heat spreader 10. As shown in FIG.

1, the encapsulant 16 may have a first surface 161 and a second surface 162 opposite to the first surface 161. In some embodiments, the first surface 161 of the encapsulant 16 may be substantially coplanar with the first surfaces 1281 of the electrical contacts 128, since they may be formed concurrently by a grinding stage. Thus, the first surfaces 1281 of the electrical contacts 128 may be exposed from the first surface 161 of the encapsulant 16. The second surface 162 of the encapsulant 16 may be substantially coplanar with the second surface 102 of the heat spreader 10.

The encapsulant 16 may cover and/or contact the lateral side surface 123 of the electronic device 12, the lateral side surface 113 of the intermediate layer 11 and the lateral side surface 103 of the heat spreader 10. In addition, the encapsulant 16 may include a plurality of truncated fillers exposed on the first surface 161 of the encapsulant 16 since the first surface 161 of the encapsulant 16 may be ground. Thus, a flat end surface of each of the truncated fillers is substantially coplanar with the first surface 161 of the encapsulant 16.

The wiring structure 3 may be formed, attached or disposed on the first surface 161 of the encapsulant 16 and the first surfaces 1281 of the electrical contacts 128, and electrically connected to the electrical contacts 128 of the electronic device 12. Thus, the electronic device 12 is electrically connected to the wiring structure 3 through the electrical contacts 128. The wiring structure 3 may be a routing structure or a redistribution layer (RDL) structure, and has a first surface 31 and a second surface 32 opposite to the first surface 31. The second surface 32 of the wiring structure 3 may contact the first surface 161 of the encapsulant 16 and the first surfaces 1281 of the electrical contacts 128. The wiring structure 3 may include at least one dielectric layer (including, for example, a first dielectric layer 34, a second dielectric layer 36, a third dielectric layer 38 and a fourth dielectric layer 50), at least one circuit layer (including, for example, a first circuit layer 35, a second circuit layer 37 and a third circuit layer 39) in contact with or interposed between the dielectric layers 34, 36, 38, 50, and a plurality of conductive vias (including, for example, a plurality of first conductive vias 353, a plurality of second conductive vias 373 and a plurality of third conductive vias 393) embedded in the dielectric layers 34, 36, 38.

In some embodiments, each of the dielectric layers (including, for example, the first dielectric layer 34, the second dielectric layer 36, the third dielectric layer 38 and the fourth dielectric layer 50) may include, or be formed from, a photoresist layer, a passivation layer, a cured photo sensitive material, a cured photoimageable dielectric (PID) material such as epoxy, polypropylene (PP), or polyimide (PI) including photoinitiators, or a combination of two or more thereof.

Each of the circuit layers 35, 37, 39 may include a plurality of traces and a plurality of pads. The circuit layers 35, 37, 39 are electrically connected to one another through the conductive vias (including, for example, the first conductive vias 353, the second conductive vias 373 and the third conductive vias 393). For example, the first dielectric layer 34 is an outermost dielectric layer that is formed or disposed on the first surface 161 of the encapsulant 16. Thus, the first dielectric layer 34 contacts the encapsulant 16 directly. Further, the first dielectric layer 34 may define a plurality of openings extending through the first dielectric layer 34 and corresponding to the electrical contacts 128 so as to expose the electrical contacts 128.

The first circuit layer 35 is an outermost circuit layer that is formed or disposed on the first dielectric layer 34. The first conductive vias 353 are disposed in the openings of the first dielectric layer 34 and extend through the first dielectric layer 34 to contact the electrical contacts 128 directly. Thus, the electrical contacts 128 are electrically connected to the first circuit layer 35 through the first conductive vias 353. In some embodiments, the first circuit layer 35 and the first conductive vias 353 are formed integrally and concurrently. That is, the first conductive vias 353 are portions of the first circuit layer 35. In some embodiments, the first circuit layer 35 and the first conductive vias 353 may include a seed layer 351 and a conductive layer 352 disposed on the seed layer 351. As shown in FIG. 1, the electrical contacts 128 of the electronic device 12 contact the seed layer 351 of the first conductive via 353 of the outermost circuit layer (i.e., the first circuit layer 35) of the wiring structure 3 directly. In addition, the first conductive via 353 may taper toward the electrical contact 128 of the electronic device 12, and a width of a top portion of the first conductive via 353 may be less than or equal to a width of the electrical contact 128 of the electronic device 12.

The second dielectric layer 36 is formed or disposed on the first dielectric layer 34 to cover the first circuit layer 35. Further, the second dielectric layer 36 may define a plurality of openings extending through the second dielectric layer 36. The second circuit layer 37 is formed or disposed on the second dielectric layer 36. The second conductive vias 373 are disposed in the openings of the second dielectric layer 36 and extend through the second dielectric layer 36 to contact the first circuit layer 35. Thus, the second circuit layer 37 is electrically connected to the first circuit layer 35 through the second conductive vias 373. In some embodiments, the second circuit layer 37 and the second conductive vias 373 are formed integrally and concurrently. In some embodiments, the second circuit layer 37 and the second conductive vias 373 may include a seed layer 371 and a conductive layer 372 disposed on the seed layer 371. In addition, the second conductive vias 373 may taper upward.

The third dielectric layer 38 is formed or disposed on the second dielectric layer 36 to cover the second circuit layer 37. Further, the third dielectric layer 38 may define a plurality of openings extending through the third dielectric layer 38. The third circuit layer 39 is formed or disposed on the third dielectric layer 38. The third conductive vias 393 are disposed in the openings of the third dielectric layer 38 and extend through the third dielectric layer 38 to contact the second circuit layer 37. Thus, the third circuit layer 39 is electrically connected to the second circuit layer 37 through the third conductive vias 393. In some embodiments, the third circuit layer 39 and the third conductive vias 393 are formed integrally and concurrently. In some embodiments, the third circuit layer 39 and the third conductive vias 393 may include a seed layer 391 and a conductive layer 392 disposed on the seed layer 391. In addition, the third conductive vias 393 may taper upward.

The fourth dielectric layer 50 is formed or disposed on the third dielectric layer 38 to cover the third circuit layer 39. Further, the fourth dielectric layer 50 may define a plurality of openings extending through the fourth dielectric layer 50. An UBM may be disposed in the openings of the fourth dielectric layer 50 to contact the third circuit layer 39. The external connectors 22 (e.g., solder materials) are disposed on the UBM in the openings of the fourth dielectric layer 50 and protrude from the fourth dielectric layer 50 for external connection.

In the embodiment illustrated in FIG. 1, the intermediate layer 11 may include a sintered material, thus, a bonding force between the intermediate layer 11 and the heat spreader 10 may be relatively large, for example, greater than a bonding force between a thermal interface material (TIM) and a heat spreader. In addition, a bonding force between the intermediate layer 11 and the electronic device 12 may be relatively large, for example, greater than a bonding force between a thermal interface material (TIM) and an electronic device. Therefore, during the molding process, the electronic device 12 may not be shifted from its predetermined position.

Figure 1A:
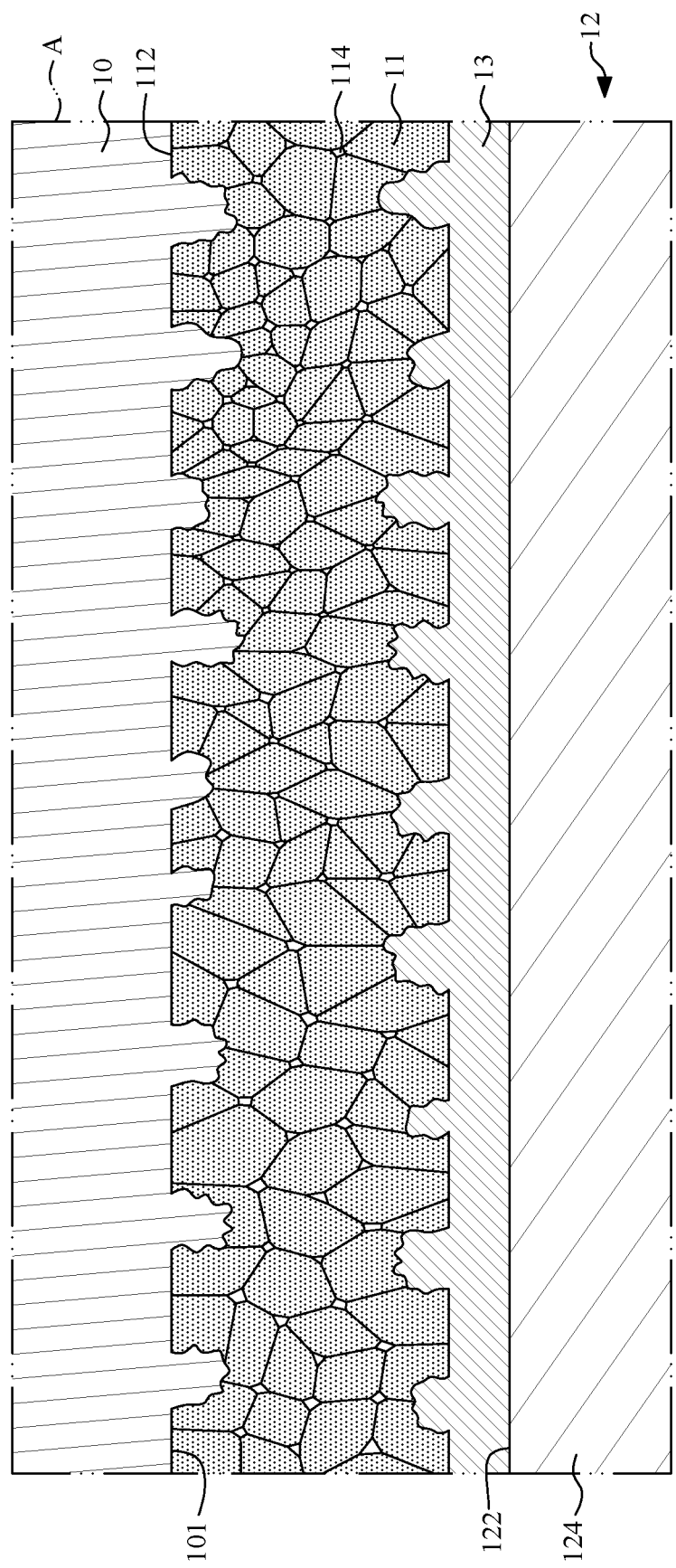
FIG. 1A illustrates an enlarged view of a region "A" in FIG. 1.

FIG. 1A illustrates an enlarged view of a region "A" in FIG. 1. As shown in FIG. 1A, the intermediate layer 11 may include a porous material that defines a plurality of pores 114 having a size of about 0.1 μm. In addition, an interface (e.g., a top surface of the bonding promoter 13) between the bonding promoter 13 and the intermediate layer 11 is discontinuous. For example, a portion of the bonding promoter 13 may protrude from the interface (e.g., the top surface of the bonding promoter 13) between the bonding promoter 13 and the intermediate layer 11, and may extend into the intermediate layer 11. Similarly, an interface (e.g., the second surface 112 of the intermediate layer 11 or the first surface 101 of the heat spreader 10) between the heat spreader 10 and the intermediate layer 11 is discontinuous. For example, a portion of the heat spreader 10 may protrude from the interface (e.g., the second surface 112 of the intermediate layer 11 or the first surface 101 of the heat spreader 10) between the heat spreader 10 and the intermediate layer 11, and may extend into the intermediate layer 11.

Figure 1B:
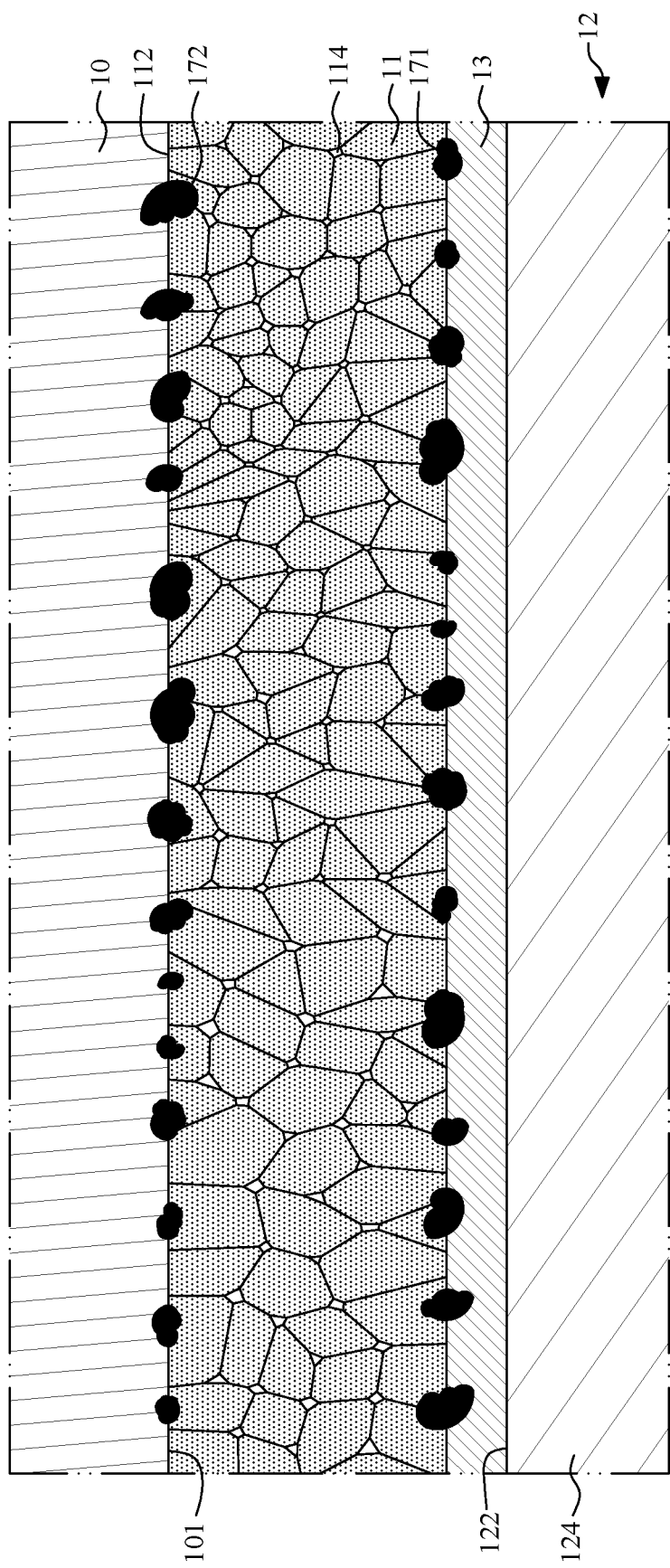
FIG. 1B illustrates an enlarged view of a region of an intermediate layer of a package structure according to some embodiments of the present disclosure.

FIG. 1B illustrates an enlarged view of a region of an intermediate layer of a package structure according to some embodiments of the present disclosure. As shown in FIG. 1B, a plurality of first intermetallic compounds (IMCs) 171 may be formed or disposed at the interface (e.g., the top surface of the bonding promoter 13) between the bonding promoter 13 and the intermediate layer 11. Further, a plurality of second intermetallic compounds (IMCs) 172 may be formed or disposed at the interface (e.g., the second surface 112 of the intermediate layer 11 or the first surface 101 of the heat spreader 10) between the heat spreader 10 and the intermediate layer 11. A material of the first intermetallic compounds (IMCs) 171 may be same as or different from a material of the second intermetallic compounds (IMCs) 172.

Figure 2:
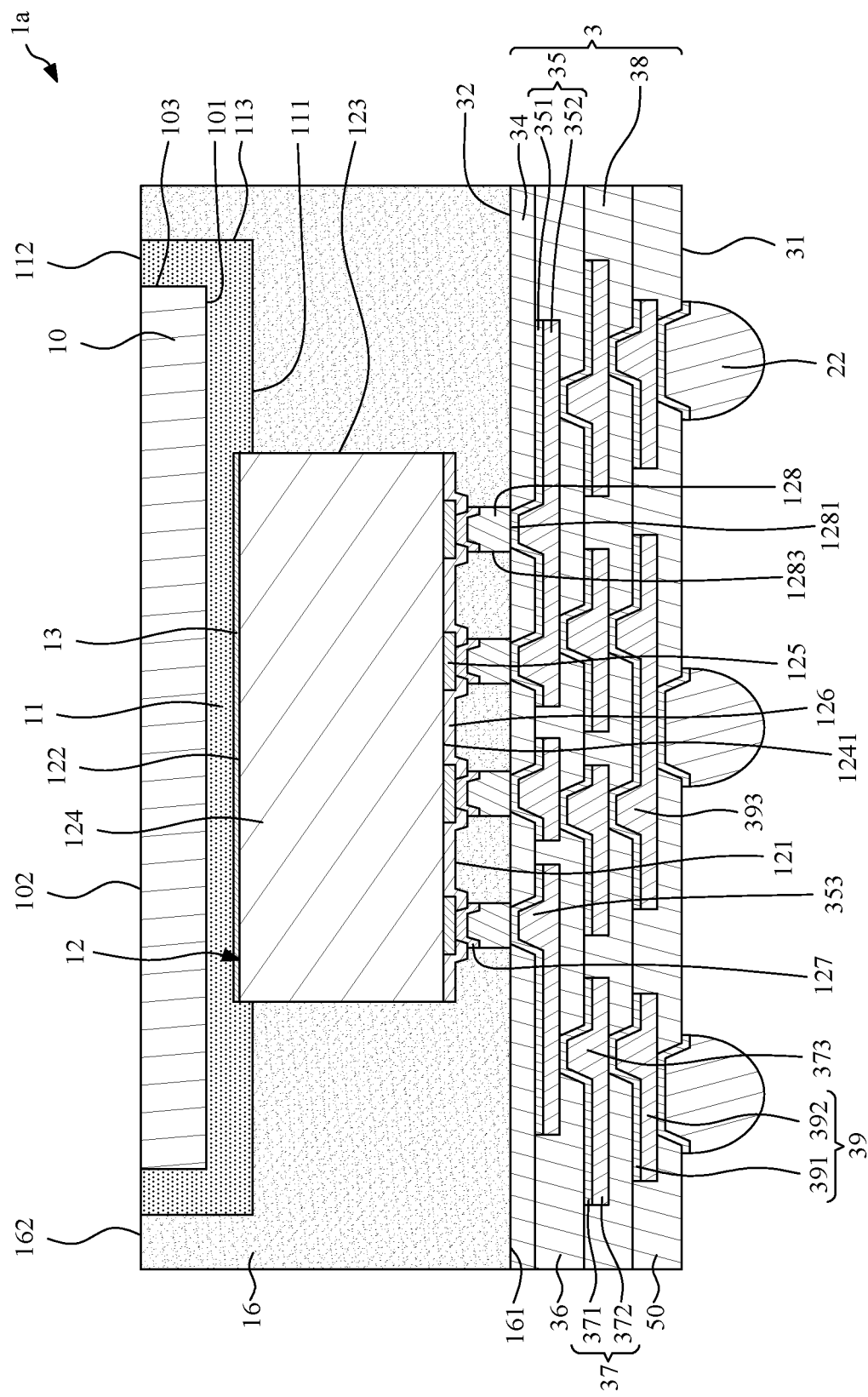
FIG. 2 illustrates a cross-sectional view of a package structure according to some embodiments of the present disclosure.

FIG. 2 illustrates a cross-sectional view of a package structure 1a according to some embodiments of the present disclosure. The package structure 1a of FIG. 2 is similar to the package structure 1 of FIG. 1 except that a size of the intermediate layer 11 is greater than a size of the heat spreader 10. Thus, the intermediate layer 11 covers and contacts the lateral side surface 103 of the heat spreader 10. In addition, the second surface 162 of the encapsulant 16 may be substantially coplanar with the second surface 102 of the heat spreader 10 and the second surface 112 of the intermediate layer 11.

Figure 3:
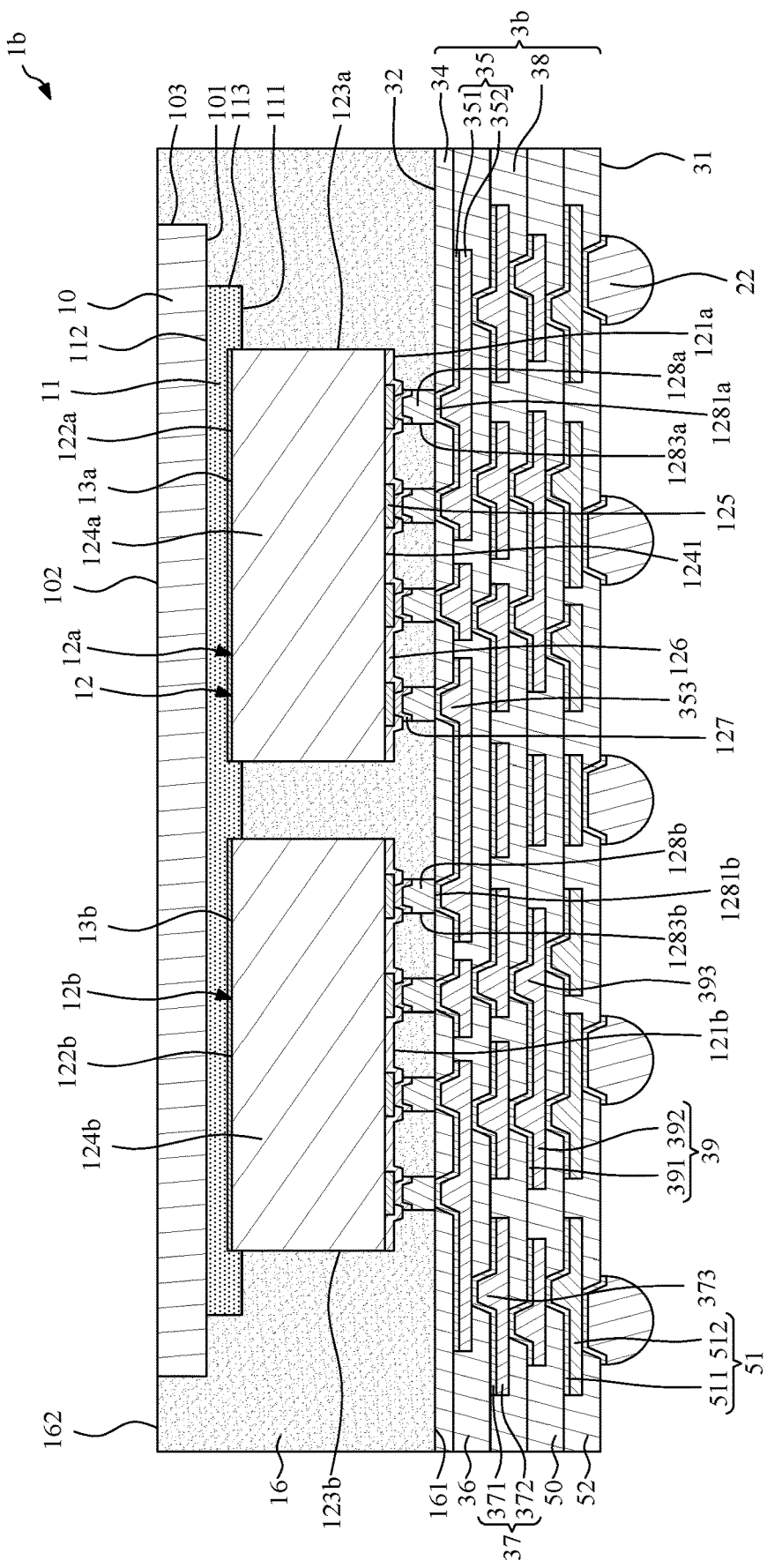
FIG. 3 illustrates a cross-sectional view of a package structure according to some embodiments of the present disclosure.

FIG. 3 illustrates a cross-sectional view of a package structure 1b according to some embodiments of the present disclosure. The package structure 1b of FIG. 3 is similar to the package structure 1 of FIG. 1 except that the electronic device 12 of FIG. 3 includes a first electronic device 12a and a second electronic device 12b disposed side by side, and the wiring structure 3b of FIG. 3 further includes a fourth circuit layer 51 and a fifth dielectric layer 52.

The function and size of the first electronic device 12a may be same as or different from the function and size of the second electronic device 12b, and a gap between the first electronic device 12a and the second electronic device 12b may be in a range of 2 μm to 50 μm, or 2 μm to 100 μm, or 2 μm to 150 μm. The first electronic device 12a of FIG. 3 may be similar to or same as the electronic device 12 of FIG. 1. In some embodiments, the first electronic device 12a has a first surface 121a (e.g., a bottom surface or an active surface), a second surface 122a (e.g., a top surface or a backside surface) opposite to the first surface 121, and a periphery lateral surface 123a extending between the first surface 121a and the second surface 122a. The first electronic device 12a may include a main body 124a, a plurality of pads 125, a passivation layer 126, a plurality of under bump metallurgies (UBMs) 127, and a plurality of first electrical contacts 128a. A material of the main body 124a may include silicon, germanium, and/or other suitable material. The pads 125 may be disposed adjacent to or on a first surface 1241 (e.g., a bottom surface) of the main body 124a. Alternatively, the pads 125 may be in proximity to, or embedded in and exposed at the first surface 121a of the first electronic device 12a. In some embodiments, the pads 125 may be included in a circuit layer, the material of which is aluminum, copper or an alloy or a mixture of aluminum-copper. The passivation layer 126 covers the pads 125 and the first surface 1241 of the main body 124a, and defines a plurality of openings to expose a portion of each of the pads 125. The passivation layer 126 may be a solder mask (the material of which is, for example, PI), an oxide layer or a nitride layer. The UBMs 127 are disposed at the openings of the passivation layer 126, and contact the pads 125.

The first electrical contacts 128a are disposed on the UBMs 127. Thus, the first electrical contacts 128a are disposed adjacent to the first surface 121a of the first electronic device 12a. The first electrical contacts 128a may be bumps, posts or pillars that stand on and connect the pads 125 through the UBMs 127. Each of the first electrical contacts 128a may have a first surface 1281a (e.g., a bottom surface) and a periphery side surface 1283a. The first electronic device 12a may be electrically connected to the wiring structure 3b through the first electrical contacts 128a.

A first bonding promoter 13a may be disposed on the second surface 122a of the first electronic device 12a. Thus, the first bonding promoter 13a may be interposed between the first electronic device 12a and the intermediate layer 11. The first bonding promoter 13a may include at least one seed layer or metal layer (e.g., copper layer, titanium layer and/or stainless steel layer). In some embodiments, the first bonding promoter 13a may be a portion of the first electronic device 12a. In some embodiments, the first bonding promoter 13a may be omitted.

The second electronic device 12b of FIG. 3 may be similar to or same as the first electronic device 12a of FIG. 3 or the electronic device 12 of FIG. 1. In some embodiments, the second electronic device 12b has a first surface 121b (e.g., a bottom surface or an active surface), a second surface 122b (e.g., a top surface or a backside surface) opposite to the first surface 121b, and a periphery lateral surface 123b extending between the first surface 121b and the second surface 122b. The second electronic device 12b may include a main body 124b, a plurality of pads 125, a passivation layer 126, a plurality of under bump metallurgies (UBMs) 127, and a plurality of second electrical contacts 128b. The second electrical contacts 128b are disposed on the UBMs 127. Thus, the second electrical contacts 128b are disposed adjacent to the first surface 121b of the second electronic device 12b. The second electrical contacts 128b may be bumps, posts or pillars that stand on and connect the pads 125 through the UBMs 127. Each of the second electrical contacts 128b may have a first surface 1281b (e.g., a bottom surface) and a periphery side surface 1283b. The second electronic device 12b may be electrically connected to the wiring structure 3b through the second electrical contacts 128b.

A second bonding promoter 13b may be disposed on the second surface 122b of the second electronic device 12b. Thus, the second bonding promoter 13b may be interposed between the second electronic device 12b and the intermediate layer 11. The second bonding promoter 13b may include at least one seed layer or metal layer (e.g., copper layer, titanium layer and/or stainless steel layer). In some embodiments, the second bonding promoter 13b may be a portion of the second electronic device 12b. In some embodiments, the second bonding promoter 13b may be omitted.

The intermediate layer 11 is a monolithic structure and is attached to the heat spreader 10. A portion of the intermediate layer 11 is interposed between the first electronic device 12a and the heat spreader 10, and used for bonding the first electronic device 12a and the heat spreader 10. Thus, the first electronic device 12a with the first bonding promoter 13a may be attached or fastened to the heat spreader 10 through the intermediate layer 11. Similarly, a portion of the intermediate layer 11 is interposed between the second electronic device 12b and the heat spreader 10, and used for bonding the second electronic device 12b and the heat spreader 10. Thus, the second electronic device 12b with the second bonding promoter 13b may be attached or fastened to the heat spreader 10 through the intermediate layer 11.

The intermediate layer 11 may be also referred to as a "reinforcement layer". The intermediate layer 11 is in contact with the first bonding promoter 13a, the first electronic device 12a, the second bonding promoter 13b, the second electronic device 12b and the heat spreader 10. As shown in FIG. 3, a portion of the first electronic device 12a and a portion of the second electronic device 12b are embedded in the intermediate layer 11. Thus, a portion of the intermediate layer 11 is in contact with a portion of the lateral side surface 123a of the first electronic device 12a, and a portion of the intermediate layer 11 is in contact with a portion of the lateral side surface 123b of the second electronic device 12b. As shown in FIG. 3, the intermediate layer 11 covers the first electronic device 12a, the second electronic device 12b and the gap between the first electronic device 12a and the second electronic device 12b. That is, the intermediate layer 11 covers an area defined by the first electronic device 12a, the second electronic device 12b and the gap.

The encapsulant 16 may be disposed on or in contact with the wiring structure 3b and may cover and encapsulate the first electronic device 12a, the second electronic device 12b, the intermediate layer 11 and the heat spreader 10. In some embodiments, the first surface 161 of the encapsulant 16 may be substantially coplanar with the first surfaces 1281a of the first electrical contacts 128a and the first surfaces 1281b of the second electrical contacts 128b, since they may be formed concurrently by a grinding stage. Thus, the first surfaces 1281a of the first electrical contacts 128a and the first surfaces 1281b of the second electrical contacts 128b may be exposed from the first surface 161 of the encapsulant 16.

The wiring structure 3b may be formed, attached or disposed on the first surface 161 of the encapsulant 16, the first surfaces 1281a of the first electrical contacts 128a and the first surfaces 1281b of the second electrical contacts 128b, and electrically connected to the first electrical contacts 128a of the first electronic device 12a and the second electrical contacts 128b of the second electronic device 12b.

Thus, the first electronic device 12a and the second electronic device 12b are electrically connected to the wiring structure 3b through the first electrical contacts 128a and the second electrical contacts 128b, respectively. The first electronic device 12a is electrically connected to the second electronic device 12b through the wiring structure 3b. The wiring structure 3b is similar to the wiring structure 3 of FIG. 1 except that the wiring structure 3b further includes the fourth circuit layer 51 disposed on the fourth dielectric layer 50, and the fifth dielectric layer 52 covering the fourth circuit layer 51 and the fourth dielectric layer 50. The fourth circuit layer 51 may include a seed layer 511 and a conductive layer 512 disposed on the seed layer 511.

In the embodiment illustrated in FIG. 3, the intermediate layer 11 (or reinforcement layer 11) may include a sintered material, thus, a Young's modulus of the intermediate layer 11 may be relatively large, for example, greater than 0.3 GPa or greater than 8 GPa. Thus, a warpage of the package structure 1b may be reduced. That is, the intermediate layer 11 may resist the break of the circuit layers of the wiring structure 3b caused by the warpage.

Figure 4:
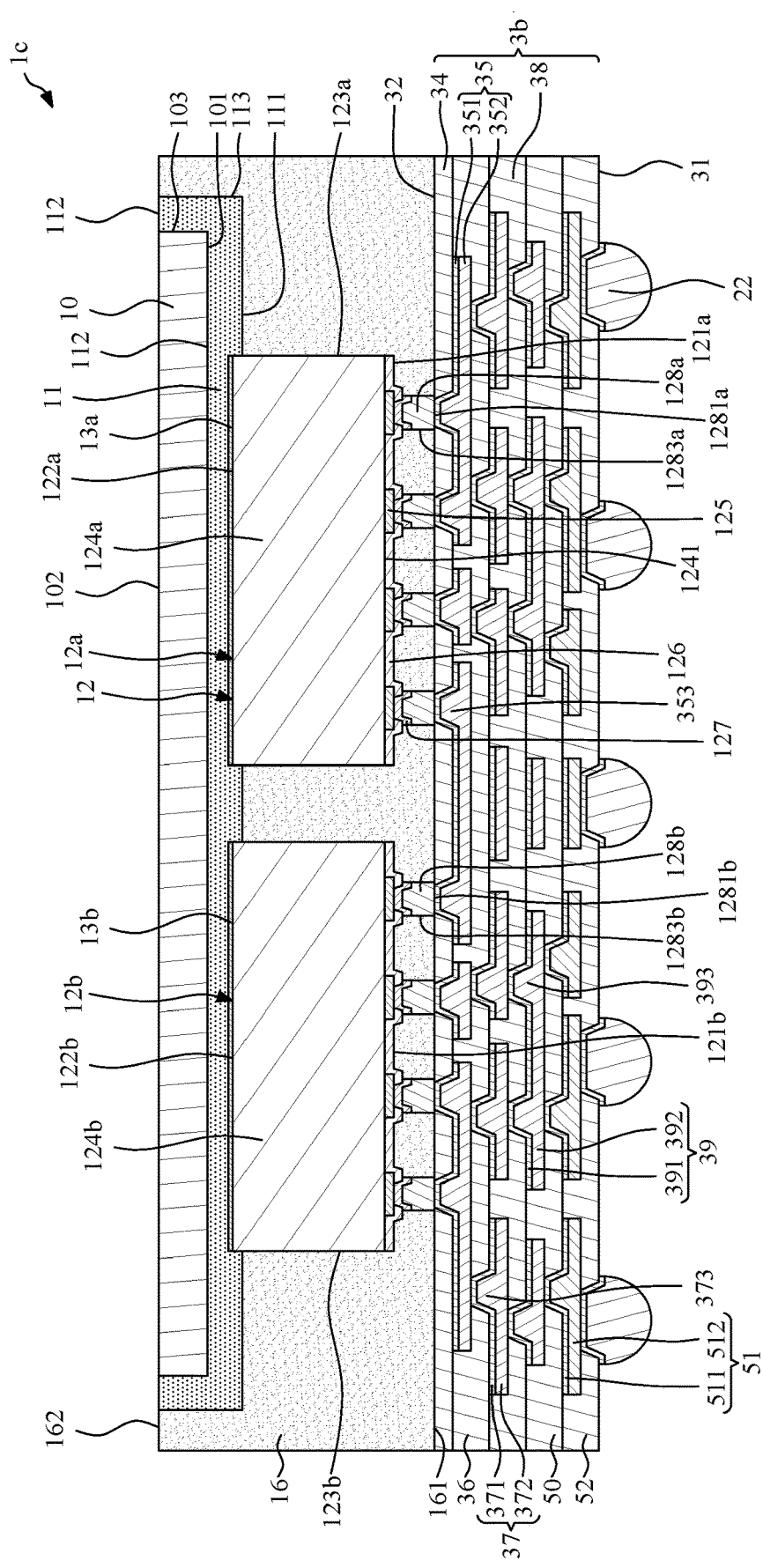
FIG. 4 illustrates a cross-sectional view of a package structure according to some embodiments of the present disclosure.

FIG. 4 illustrates a cross-sectional view of a package structure 1c according to some embodiments of the present disclosure. The package structure 1c of FIG. 4 is similar to the package structure 1b of FIG. 3 except that a size of the intermediate layer 11 is greater than a size of the heat spreader 10. Thus, the intermediate layer 11 covers and contacts the lateral side surface 103 of the heat spreader 10. In addition, the second surface 162 of the encapsulant 16 may be substantially coplanar with the second surface 102 of the heat spreader 10 and the second surface 112 of the intermediate layer 11.

Figure 5:
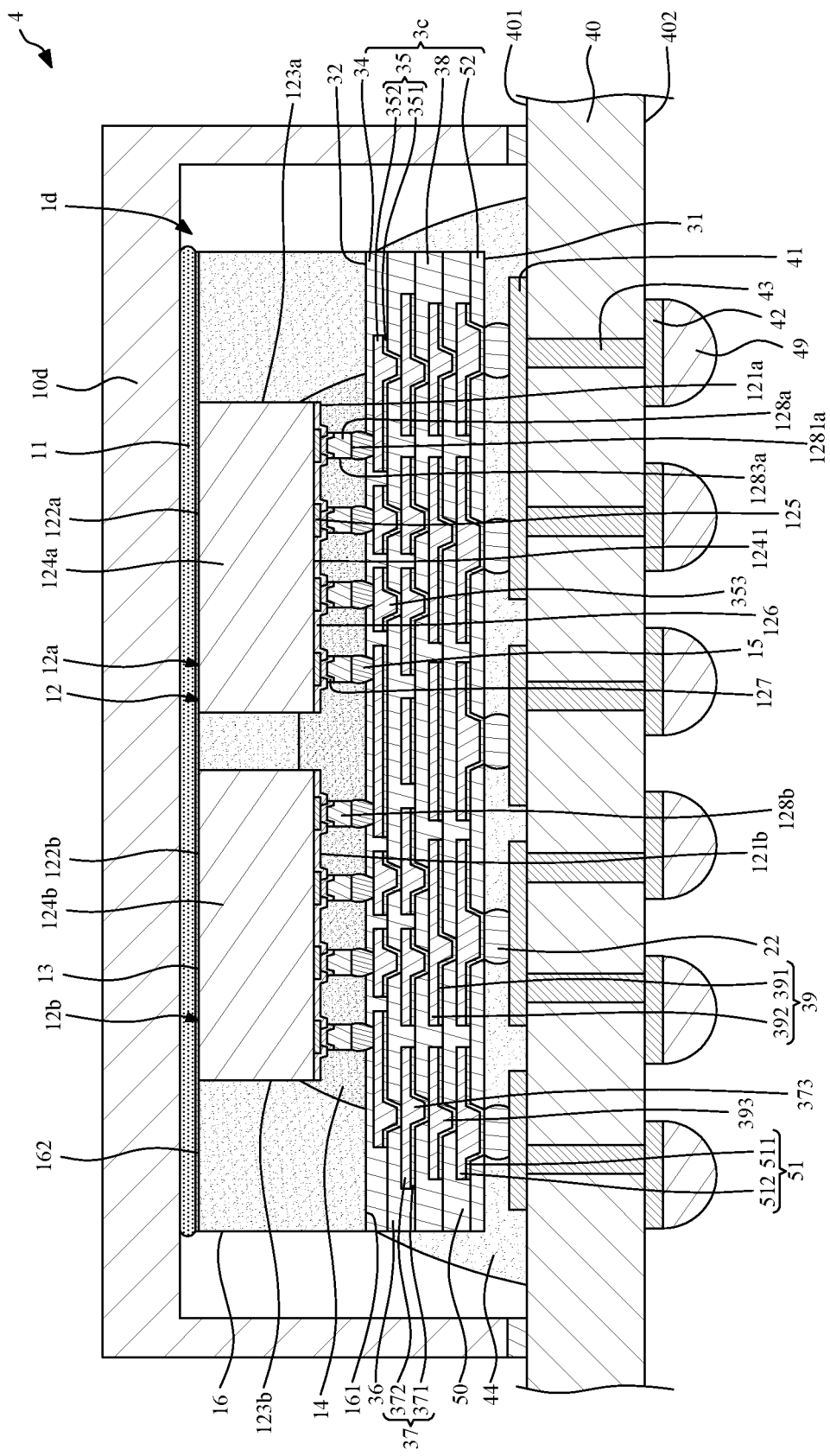
FIG. 5 illustrates a cross-sectional view of an assembly structure according to some embodiments of the present disclosure.

FIG. 5 illustrates a cross-sectional view of an assembly structure 4 according to some embodiments of the present disclosure. The assembly structure 4 may be a semiconductor package structure, and may include a base substrate 40, a package structure 1d, an intermediate layer 11, a heat spreader 10d and a plurality of external connectors 49. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 5, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 1d may include a wiring structure 3c, a first electronic device 12a, a second electronic device 12b, an encapsulant 16, a bonding promoter 13 and a plurality of external connectors 22. The first electronic device 12a and the second electronic device 12b may be the same as or similar to the first electronic device 12a and the second electronic device 12b of FIG. 3, respectively.

The wiring structure 3c of FIG. 5 may be the same as or similar to the wiring structure 3b of FIG. 3 except the orientations of the internal elements. In some embodiments, the first circuit layer 35 is embedded in the first dielectric layer 34, and is exposed from the top surface of the first dielectric layer 34. That is, the first dielectric layer 34 covers the first circuit layer 35, and defines a plurality of openings to expose portions of the first circuit layer 35. The first dielectric layer 34 and the first circuit layer 35 may be disposed on the second dielectric layer 36. In addition, the second dielectric layer 36 may cover the second circuit layer 37. A portion (i.e., a first conductive via 353) of the first circuit layer 35 extends through the second dielectric layer 36 to electrically connect the second circuit layer 37. In addition, the first conductive via 353 may taper downward. That is, the first conductive via 353 may taper toward the first surface 31 (e.g., a bottom surface) of the wiring structure 3c.

Similarly, the second dielectric layer 36 and the second circuit layer 37 may be disposed on the third dielectric layer 38. In addition, the third dielectric layer 38 may cover the third circuit layer 39. A portion (i.e., a second conductive via 373) of the second circuit layer 37 extends through the third dielectric layer 38 to electrically connect the third circuit layer 39. Similarly, the third dielectric layer 38 and the third circuit layer 39 may be disposed on the fourth dielectric layer 50. In addition, the fourth dielectric layer 50 may cover the fourth circuit layer 51. A portion (i.e., a third conductive via 393) of the third circuit layer 39 extends through the fourth dielectric layer 50 to electrically connect the fourth circuit layer 51. The fourth dielectric layer 50 and the fourth circuit layer 51 may be disposed on the fifth dielectric layer 52. A portion (i.e., a via portion) of the fourth circuit layer 51 extends through the fifth dielectric layer 52 to be exposed from a bottom surface of the fifth dielectric layer 52 (e.g., the first surface 31 of the wiring structure 3c).

In some embodiments, the first electrical contacts 128a of the first electronic device 12a and the second electrical contacts 128b of the second electronic device 12b may be electrically connected and physically connected to the first circuit layer 35 through a plurality of solder materials 15 in the opening of the first dielectric layer 34. In other words, the first electronic device 12a and the second electronic device 12b may be electrically connected to the wiring structure 3c by flip-chip bonding.

An underfill 14 may be disposed in a space between the first electronic device 12a and the wiring structure 3c so as to cover and protect the joints formed by the first electrical contacts 128a and the solder materials 15. Further, the underfill 14 may be further disposed in a space between the second electronic device 12b and the wiring structure 3c so as to cover and protect the joints formed by the second electrical contacts 128b and the solder materials 15.

The encapsulant 16 may be disposed on or in contact with the wiring structure 3c and may cover and encapsulate the first electronic device 12a, the second electronic device 12b and the underfill 14. In some embodiments, the second surface 162 of the encapsulant 16 may be substantially coplanar with the second surface 122a of the first electronic device 12a and the second surface 122b of the second electronic device 12b, since they may be formed concurrently by a grinding stage. Thus, the second surface 122a of the first electronic device 12a and the second surface 122b of the second electronic device 12b may be exposed from the second surface 162 of the encapsulant 16.

The bonding promoter 13 may be formed or disposed on the second surface 122a of the first electronic device 12a, the second surface 122b of the second electronic device 12b and the second surface 162 of the encapsulant 16 by, for example, physical vapor deposition (PVD).

The package structure 1d may be electrically connected to the first circuit layer 41 of the base substrate 40 through the external connectors 22 disposed on the first surface 31 of the wiring structure 3c.

A protection material 44 (i.e., an underfill) may be further included in a space between the package structure 1d and the base substrate 40 so as to cover and protect the external connectors 22 and the first circuit layer 41. Further, the heat spreader 10d may be a cap structure or a hat structure, and may define a cavity for accommodating the package structure 1d. A portion of the heat spreader 10d may be attached to the top surface of the package structure 1d through the intermediate layer 11 so as to dissipate the heat generated by the first electronic device 12a and the second electronic device 12b. Another portion (e.g., bottom portion) of the heat spreader 10d may be attached to the first surface 401 of the base substrate 40 through an adhesive material. In addition, the external connectors 49 (e.g., solder balls) are formed or disposed on the second circuit layer 42 for external connection.

Figure 6:
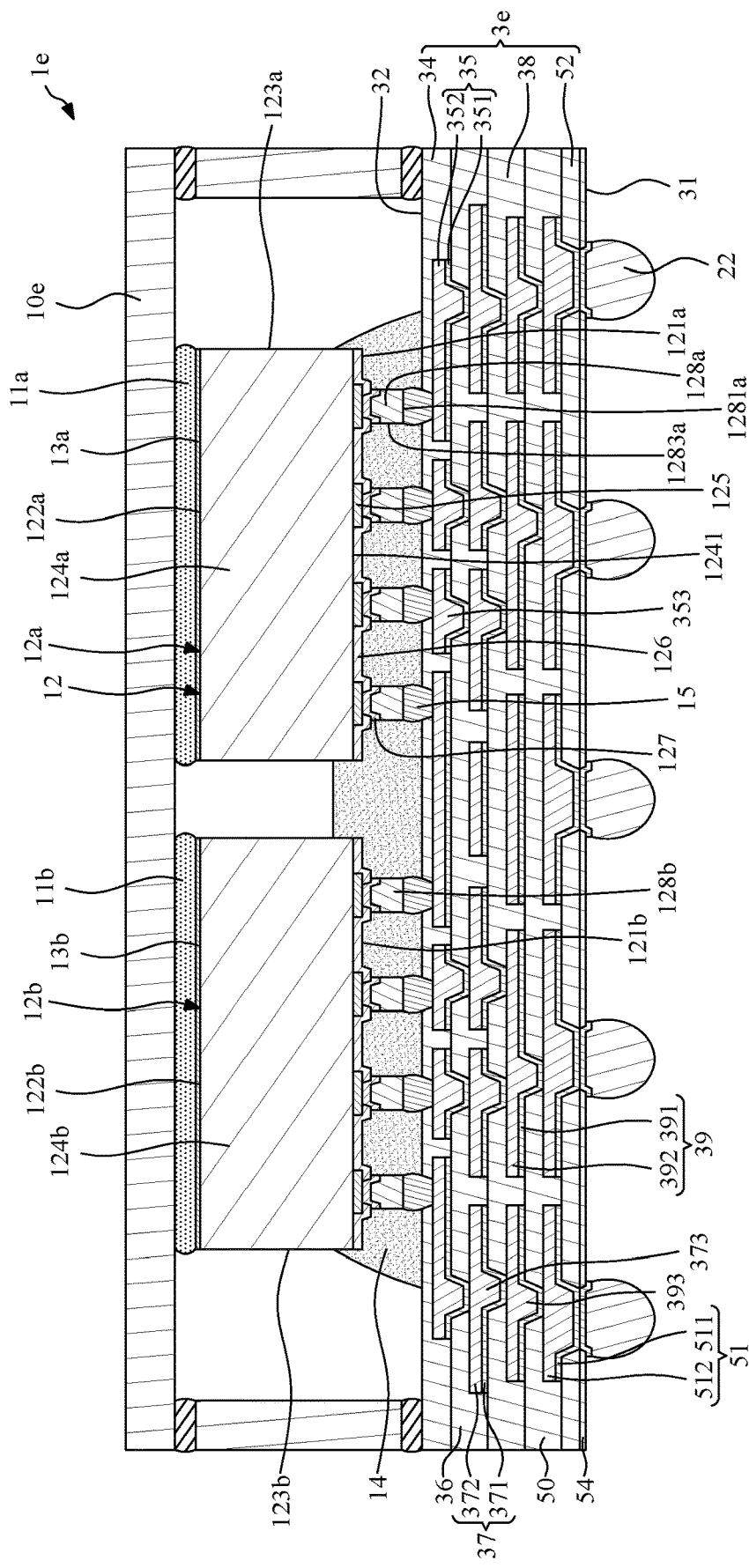
FIG. 6 illustrates a cross-sectional view of a package structure according to some embodiments of the present disclosure.

FIG. 6 illustrates a cross-sectional view of a package structure 1e according to some embodiments of the present disclosure. The package structure 1e may include a wiring structure 3e, a first electronic device 12a, a second electronic device 12b, a first bonding promoter 13a, a second bonding promoter 13b, a first intermediate layer 11a, a second intermediate layer 11b, a heat spreader 10e and a plurality of external connectors 22. The first electronic device 12a and the second electronic device 12b may be the same as or similar to the first electronic device 12a and the second electronic device 12b of FIG. 3, respectively. The wiring structure 3e of FIG. 6 may be the same as or similar to the wiring structure 3c of FIG. 5 except the wiring structure 3e further include a sixth dielectric layer 54 on the fifth dielectric layer 52. The external connectors 22 are disposed on the sixth dielectric layer 54.

In some embodiments, the first electrical contacts 128a of the first electronic device 12a and the second electrical contacts 128b of the second electronic device 12b may be electrically connected and physically connected to the first circuit layer 35 of the wiring structure 3e through the solder materials 15 in the opening of the first dielectric layer 34. An underfill 14 may be disposed in a space between the first electronic device 12a and the wiring structure 3e so as to cover and protect the joints formed by the first electrical contacts 128a and the solder materials 15. Further, the underfill 14 may be further disposed in a space between the second electronic device 12b and the wiring structure 3e so as to cover and protect the joints formed by the second electrical contacts 128b and the solder materials 15.

The first bonding promoter 13a may be disposed on the second surface 122a of the first electronic device 12a, and may be a portion of the first electronic device 12a. The first intermediate layer 11a may be disposed on the first bonding promoter 13a. Similarly, the second bonding promoter 13b may be disposed on the second surface 122b of the second electronic device 12b, and may be a portion of the second electronic device 12b. The second intermediate layer 11b may be disposed on the second bonding promoter 13b.

The heat spreader 10e may be a cap structure or a hat structure, and may define a cavity for accommodating the first electronic device 12a and the second electronic device 12b. A portion of the heat spreader 10e may be attached to the second surface 122a of the first electronic device 12a through the first intermediate layer 11a and the first bonding promoter 13a so as to dissipate the heat generated by the first electronic device 12a. A portion of the heat spreader 10e may be attached to the second surface 122b of the second electronic device 12b through the second intermediate layer 11b and the second bonding promoter 13b so as to dissipate the heat generated by the second electronic device 12b.

Another portion (e.g., bottom portion) of the heat spreader 10e may be attached to the second surface 32 of the wiring structure 3e through an adhesive material.

In the embodiment illustrated in FIG. 6, the first intermediate layer 11a and the second intermediate layer 11b may be sintered materials, thus, they may be thermoset. After a plurality of thermal cycles, the first intermediate layer 11a and the second intermediate layer 11b may not be thermally expansive or thermally shrinkable, and may maintain rigid. Thus, the first intermediate layer 11a and the second intermediate layer 11b may not flow away from the second surface 122a of the first electronic device 12a and the second surface 122b of the second electronic device 12b, respectively. As a result, the heat dissipation efficiency from the first electronic device 12a and the second electronic device 12b to the heat spreader 10e may be secured.

FIG. 7 through FIG. 15 illustrate a method for manufacturing a package structure according to some embodiments of the present disclosure. In some embodiments, the method is for manufacturing the package structure 1b shown in FIG. 3.

Figure 7:
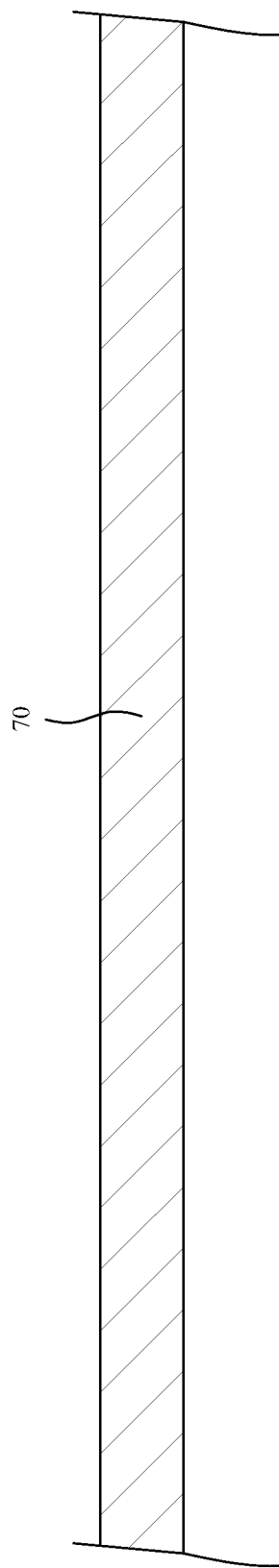
FIG. 7 illustrates one or more stages of an example of a method for manufacturing a package structure according to some embodiments of the present disclosure.

Referring to FIG. 7, a carrier 70 is provided.

Figure 8:
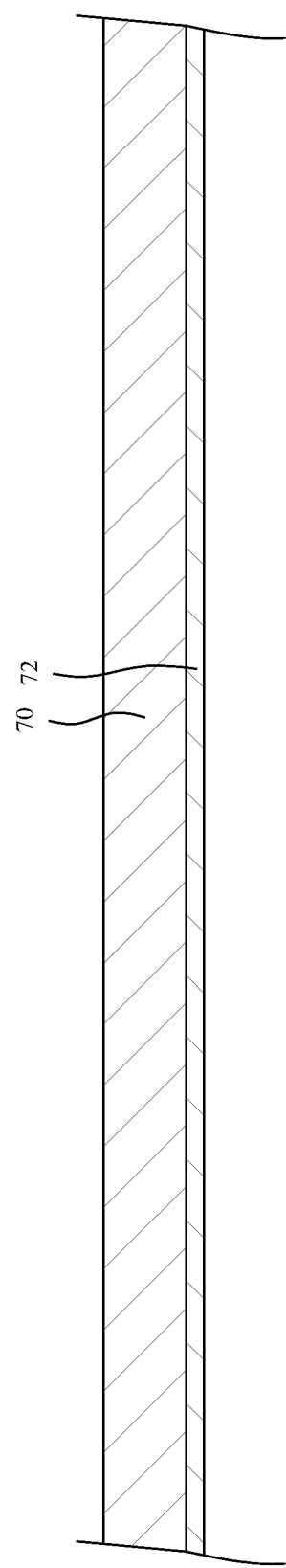
FIG. 8 illustrates one or more stages of an example of a method for manufacturing a package structure according to some embodiments of the present disclosure.

Referring to FIG. 8, a release layer 72 is formed or disposed on the carrier 70.

Figure 9:
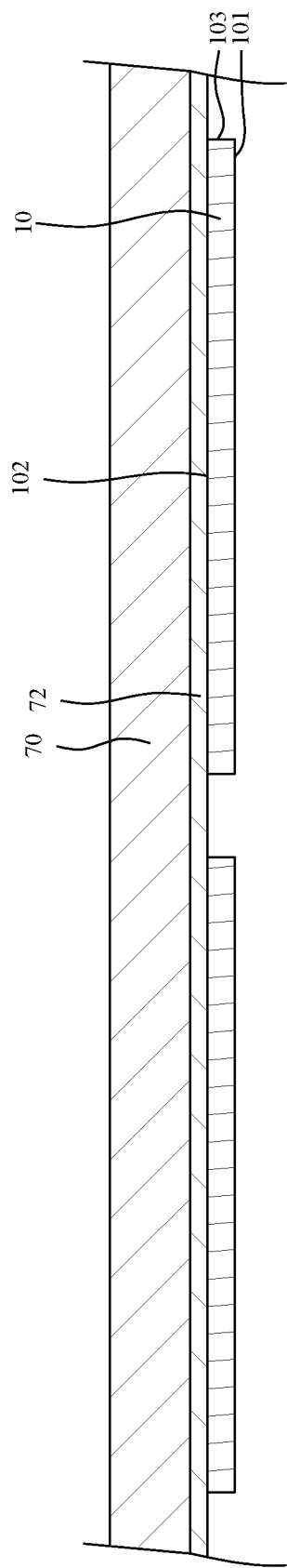
FIG. 9 illustrates one or more stages of an example of a method for manufacturing a package structure according to some embodiments of the present disclosure.

Referring to FIG. 9, at least one heat spreader 10 is formed or disposed on the release layer 72 on the carrier 70. In some embodiments, a plurality of heat spreaders 10 are formed or disposed on the release layer 72 on the carrier 70. The heat spreaders 10 may be separated metal plates. Each of the heat spreaders 10 may be the same as or similar to the heat spreader 10 of FIG. 3b. The second surface 102 of the heat spreader 10 is attached to the release layer 72 on the carrier 70.

Figure 10:
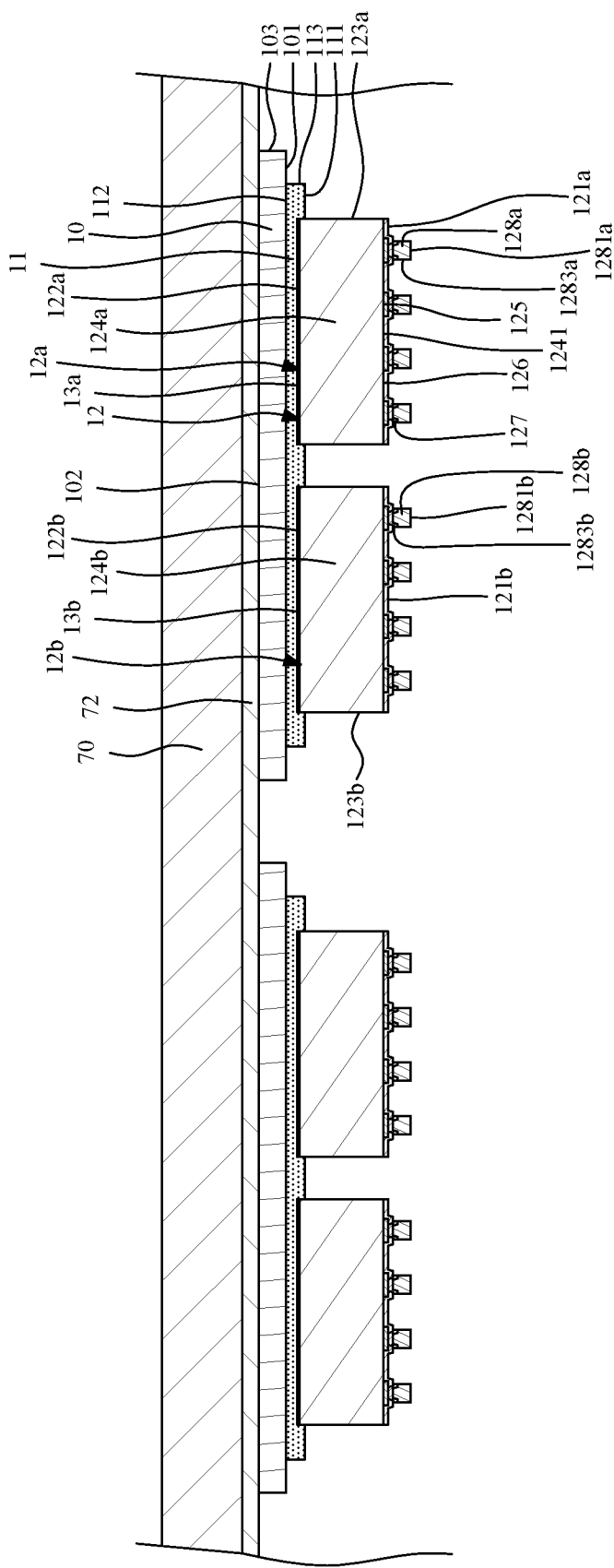
FIG. 10 illustrates one or more stages of an example of a method for manufacturing a package structure according to some embodiments of the present disclosure.

Referring to FIG. 10, at least one intermediate layer 11 is provided, formed or disposed on the at least one heat spreader 10 by, for example, printing. In some embodiments, a plurality of intermediate layers 11 are provided, formed or disposed on the heat spreaders 10. Each of the intermediate layers 11 may be the same as or similar to the intermediate layer 11 of FIG. 3b. The intermediate layer 11 may include a film type sintering material or a liquid type sintering material. The intermediate layer 11 may include epoxy and metal paste such as copper paste or silver paste.

The second surface 112 of the intermediate layer 11 may be in contact with the first surface 101 of the heat spreader 10.

Then, at least one electronic device 12 is attached on the at least one intermediate layer 11. In some embodiments, the at least one electronic device 12 may include a first electronic device 12a and a second electronic device 12b attached on one intermediate layer 11. The first electronic device 12a and the second electronic device 12b may be the same as or similar to the first electronic device 12a and the second electronic device 12b of FIG. 3b. In some embodiments, the first electronic device 12a may further include a first bonding promoter 13a disposed on the second surface 122a of the first electronic device 12a, and the second electronic device 12b may further include a second bonding promoter 13b disposed on the second surface 122b of the second electronic device 12b. As shown in FIG. 10, a portion of the first electronic device 12a with the first bonding promoter 13a is embedded in the intermediate layer 11, and a portion of the second electronic device 12b with the second bonding promoter 13b is embedded in the intermediate layer 11.

Then, the intermediate layer 11 is cured, sintered or solidified. Thus, the first electronic device 12a is attached to the heat spreader 10 through the first bonding promoter 13a and the intermediate layer 11, and the second electronic device 12b is attached to the heat spreader 10 through the second bonding promoter 13b and the intermediate layer 11.

Figure 11:
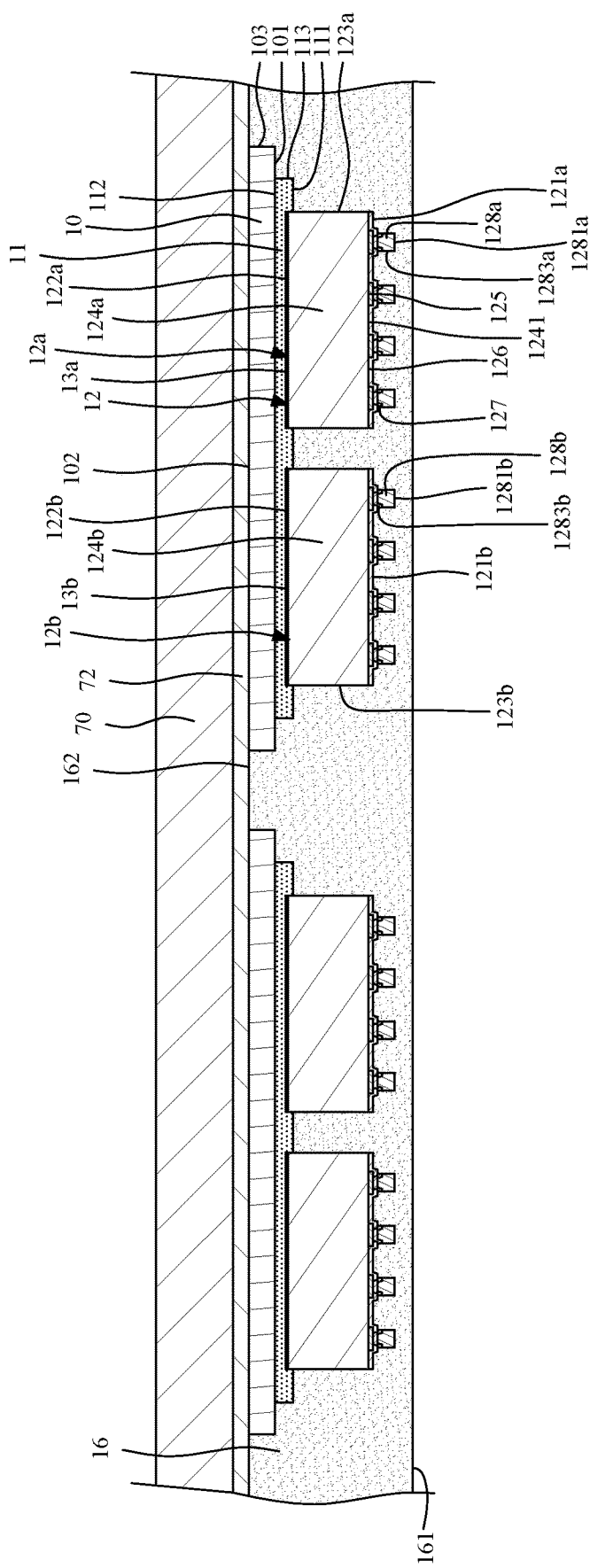
FIG. 11 illustrates one or more stages of an example of a method for manufacturing a package structure according to some embodiments of the present disclosure.

Referring to FIG. 11, an encapsulant 16 (e.g., molding compound) may be formed or disposed on the release layer 72 on the carrier 70 to encapsulate at least one electronic device 12 (e.g., the first electronic device 12a and the second electronic device 12b), the intermediate layer 11 and the heat spreader 10. In some embodiments, the encapsulant 16 covers the first surfaces 1281a of the first electrical contacts 128a of the first electronic device 12a and the first surfaces 1281b of the second electrical contacts 128b of the second electronic device 12b.

Figure 12:
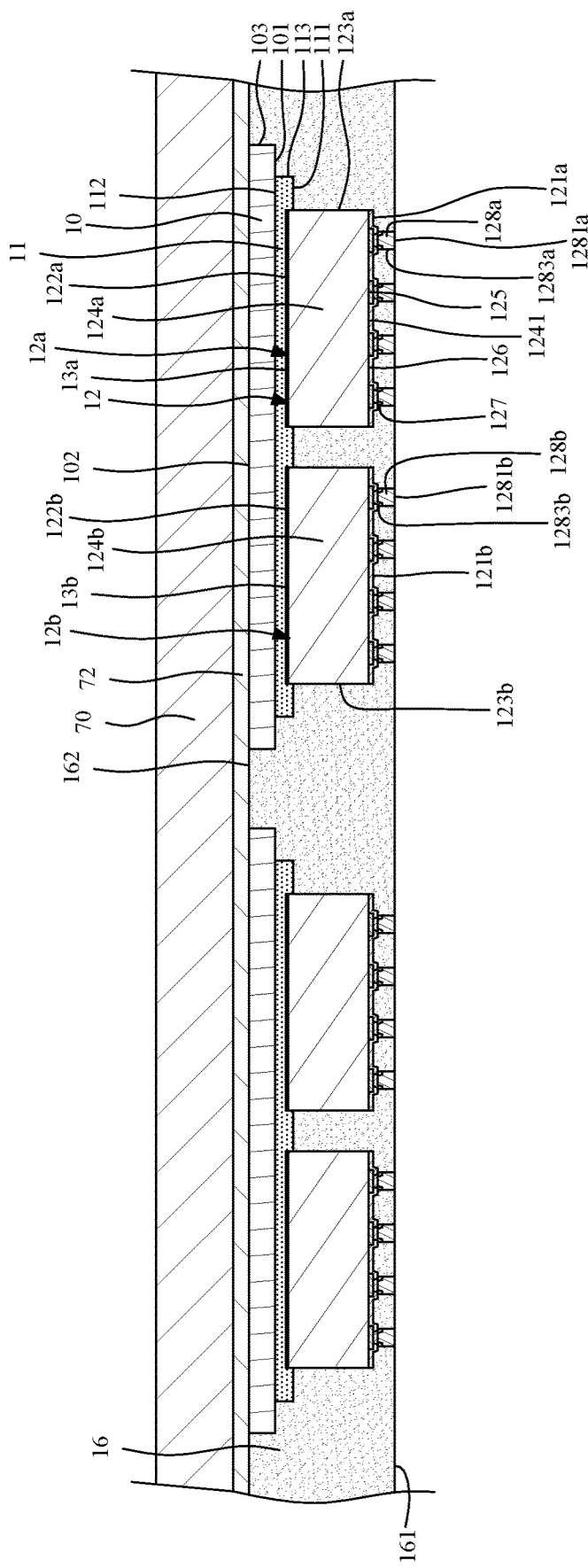
FIG. 12 illustrates one or more stages of an example of a method for manufacturing a package structure according to some embodiments of the present disclosure.

Referring to FIG. 12, the encapsulant 16 is thinned from its first surface 161 by, for example, grinding, so as to expose the first electrical contacts 128a of the first electronic device 12a and the second electrical contacts 128b of the second electronic device 12b. In some embodiments, the first surface 161 of the encapsulant 16 may be substantially coplanar with the first surfaces 1281a of the first electrical contacts 128a and the first surfaces 1281b of the second electrical contacts 128b.

Figure 13:
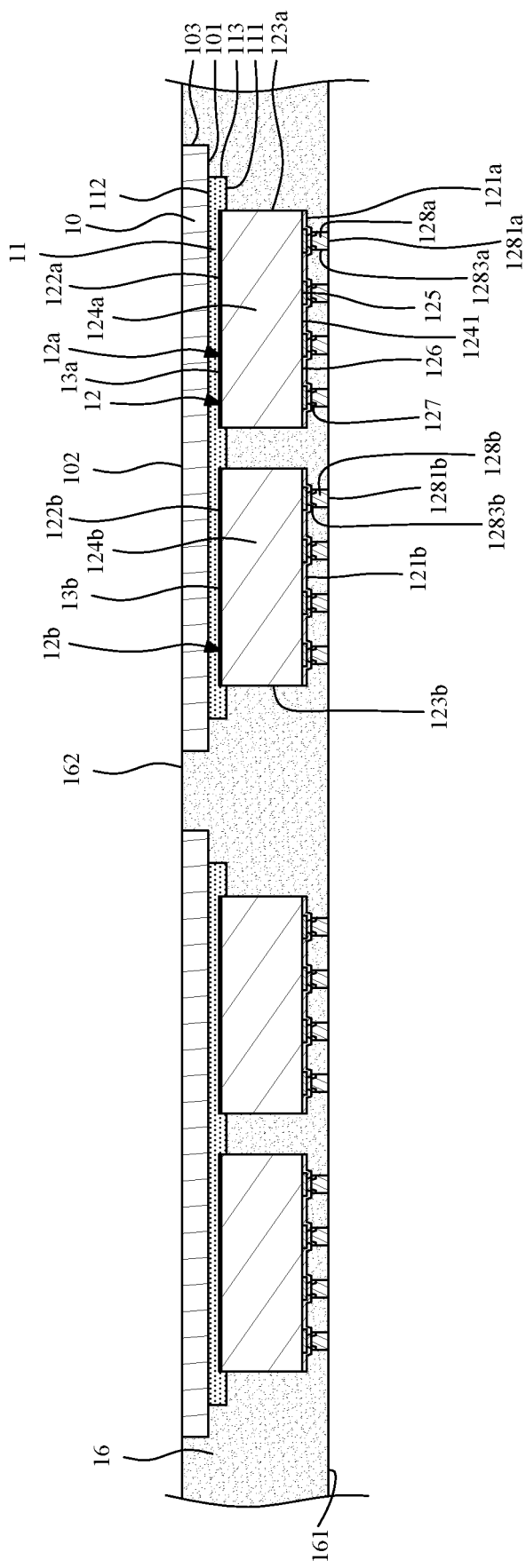
FIG. 13 illustrates one or more stages of an example of a method for manufacturing a package structure according to some embodiments of the present disclosure.

Referring to FIG. 13, the release layer 72 and the carrier 70 are removed. In some embodiments, the second surface 162 of the encapsulant 16 may be substantially coplanar with the second surface 102 of the heat spreader 10.

Figure 14:
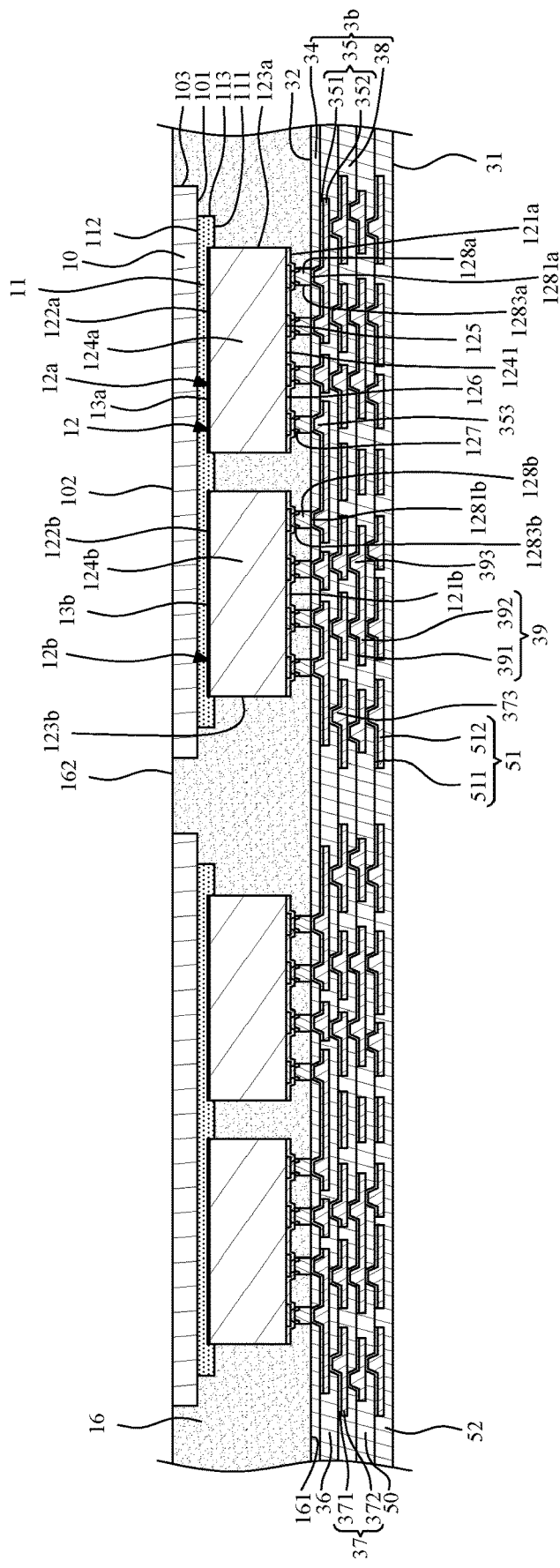
FIG. 14 illustrates one or more stages of an example of a method for manufacturing a package structure according to some embodiments of the present disclosure.

Referring to FIG. 14, a wiring structure 3b is formed, attached or disposed on the first surface 161 of the encapsulant 16, the first surfaces 1281a of the first electrical contacts 128a and the first surfaces 1281b of the second electrical contacts 128b. Thus, the first electronic device 12a and the second electronic device 12b are electrically connected to the wiring structure 3b through the first electrical contacts 128a and the second electrical contacts 128b, respectively. The wiring structure 3b may be the same as or similar to the wiring structure 3b of FIG. 3b, and may be formed on the first surface 161 of the encapsulant 16 by build-up technology.

Figure 15:
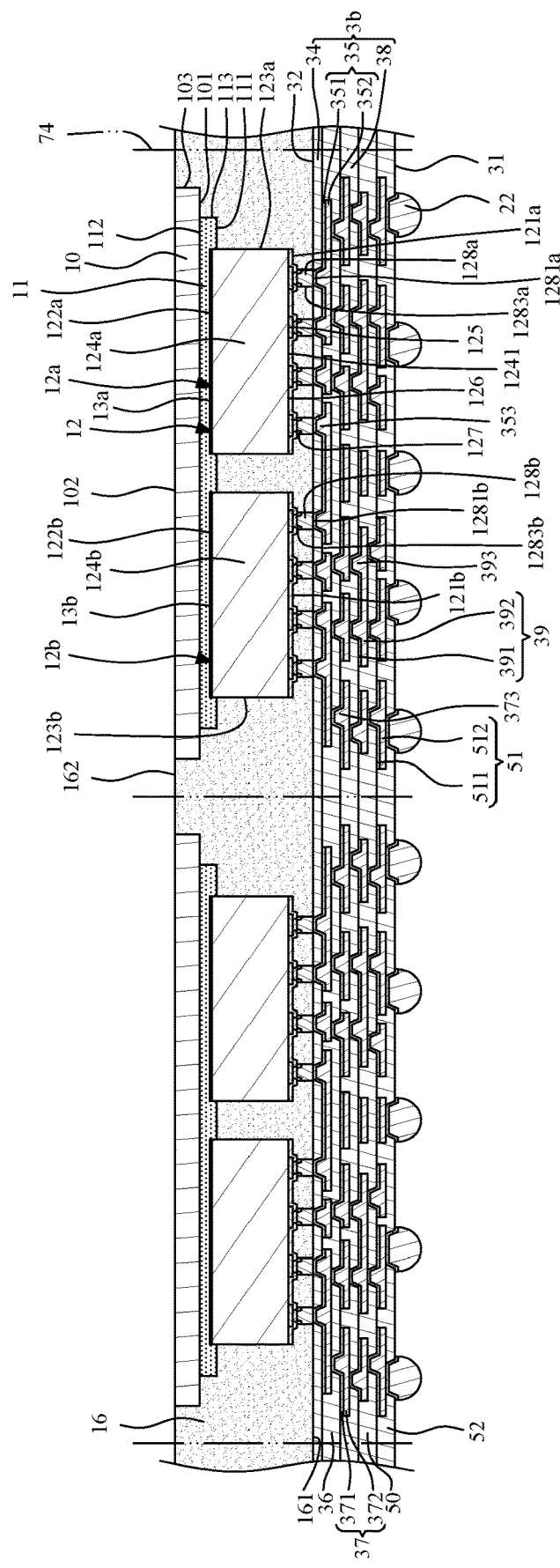
FIG. 15 illustrates one or more stages of an example of a method for manufacturing a package structure according to some embodiments of the present disclosure.

Referring to FIG. 15, the external connectors 22 (e.g., solder materials) are formed or disposed in the openings of the fifth dielectric layer 52 and protrude from the fifth dielectric layer 52 for external connection. Then, a singulation process may be conducted along the cutting lines 74 so as to obtain a plurality of package structures 1b shown in FIG. 3.

Figure 16:
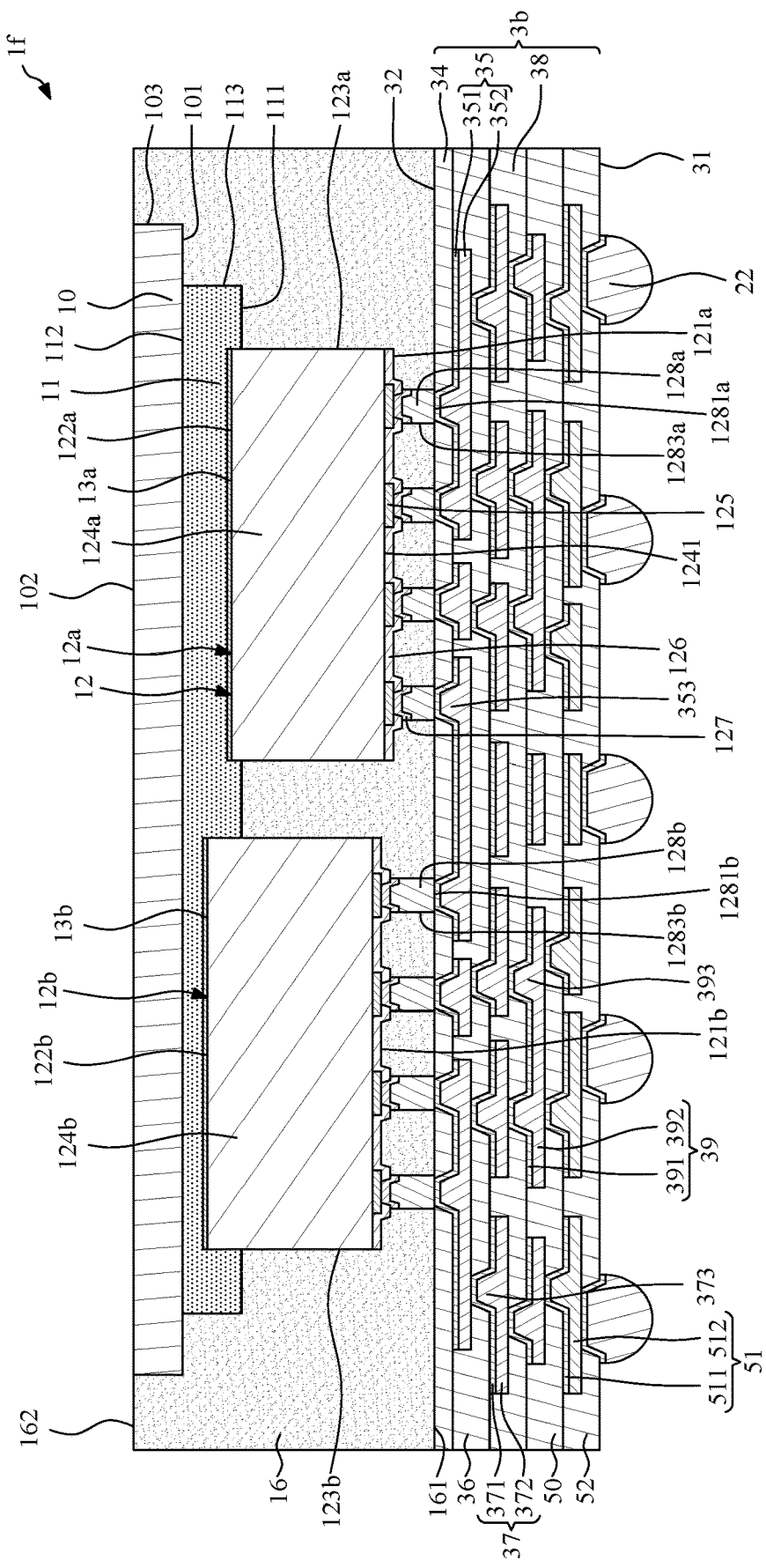
FIG. 16 illustrates a cross-sectional view of a package structure according to some embodiments of the present disclosure.

FIG. 16 illustrates a cross-sectional view of a package structure 1f according to some embodiments of the present disclosure. The package structure 1f of FIG. 16 is similar to the package structure 1b of FIG. 3 except that an elevation of the first electronic device 12a is different from an elevation of the second electronic device 12b. In some embodiments, the elevation of the second electronic device 12b may be higher than the elevation of the first electronic device 12a. Thus, the second surface 122b of the second electronic device 12b may be higher than the second surface 122a of the first electronic device 12a. That is, a portion of the second electronic device 12b embedded in the intermediate layer 11 is thicker than a portion of the first electronic device 12a embedded in the intermediate layer 11. In addition, a length of the second electrical contact 128b of the second electronic device 12b is greater than a length of the first electrical contact 128a of the first electronic device 12a.

Figure 17:
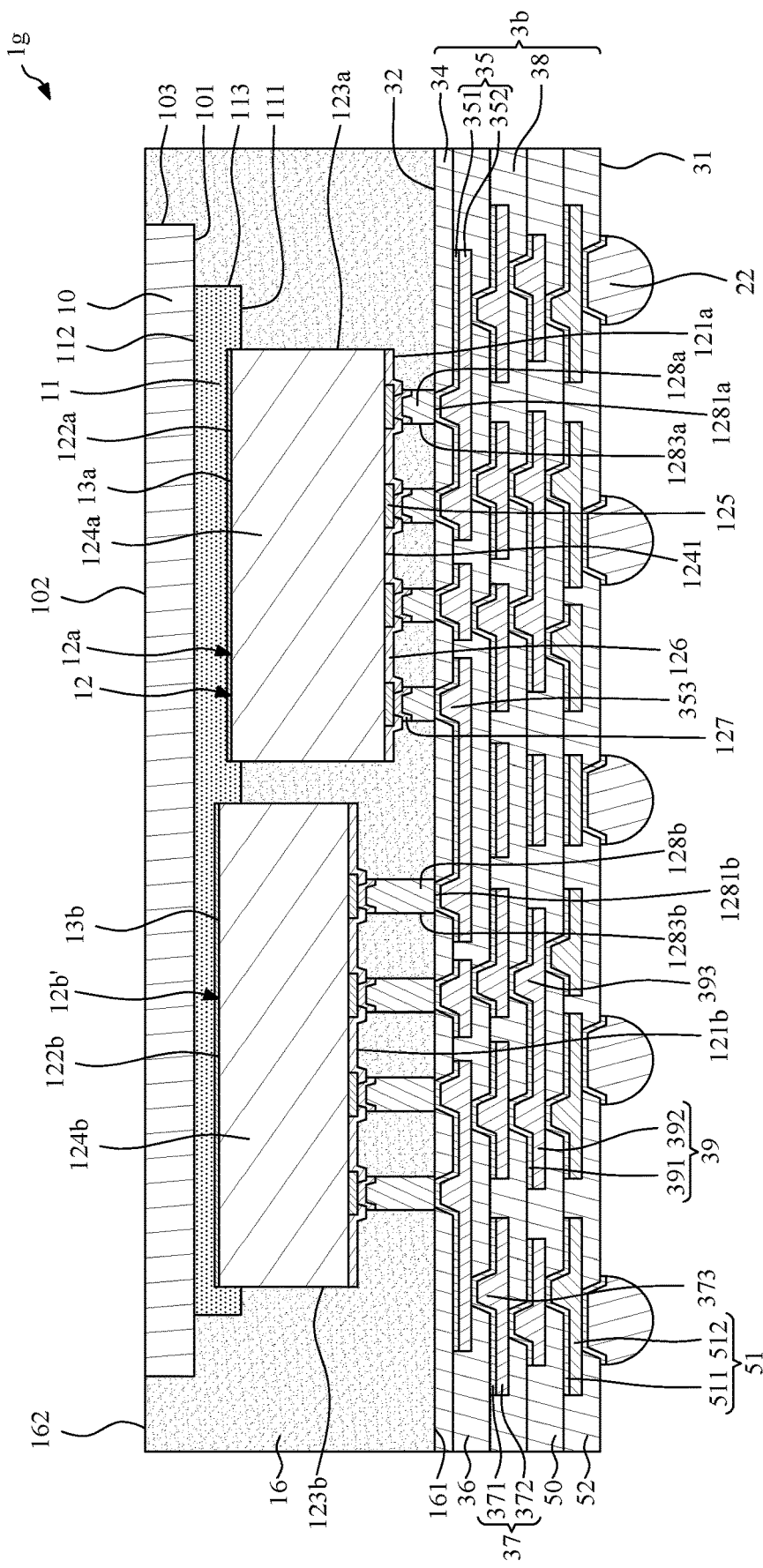
FIG. 17 illustrates a cross-sectional view of a package structure according to some embodiments of the present disclosure.

FIG. 17 illustrates a cross-sectional view of a package structure 1g according to some embodiments of the present disclosure. The package structure 1g of FIG. 17 is similar to the package structure 1f of FIG. 16 except that the second electronic device 12b' of FIG. 17 is wider and thinner than the second electronic device 12b of FIG. 16. As shown in FIG. 17, a size of the second electronic device 12b' may be different from a size of the first electronic device 12a. Thus, the second electronic device 12b' may be wider and thinner than the first electronic device 12a.

Figure 18:
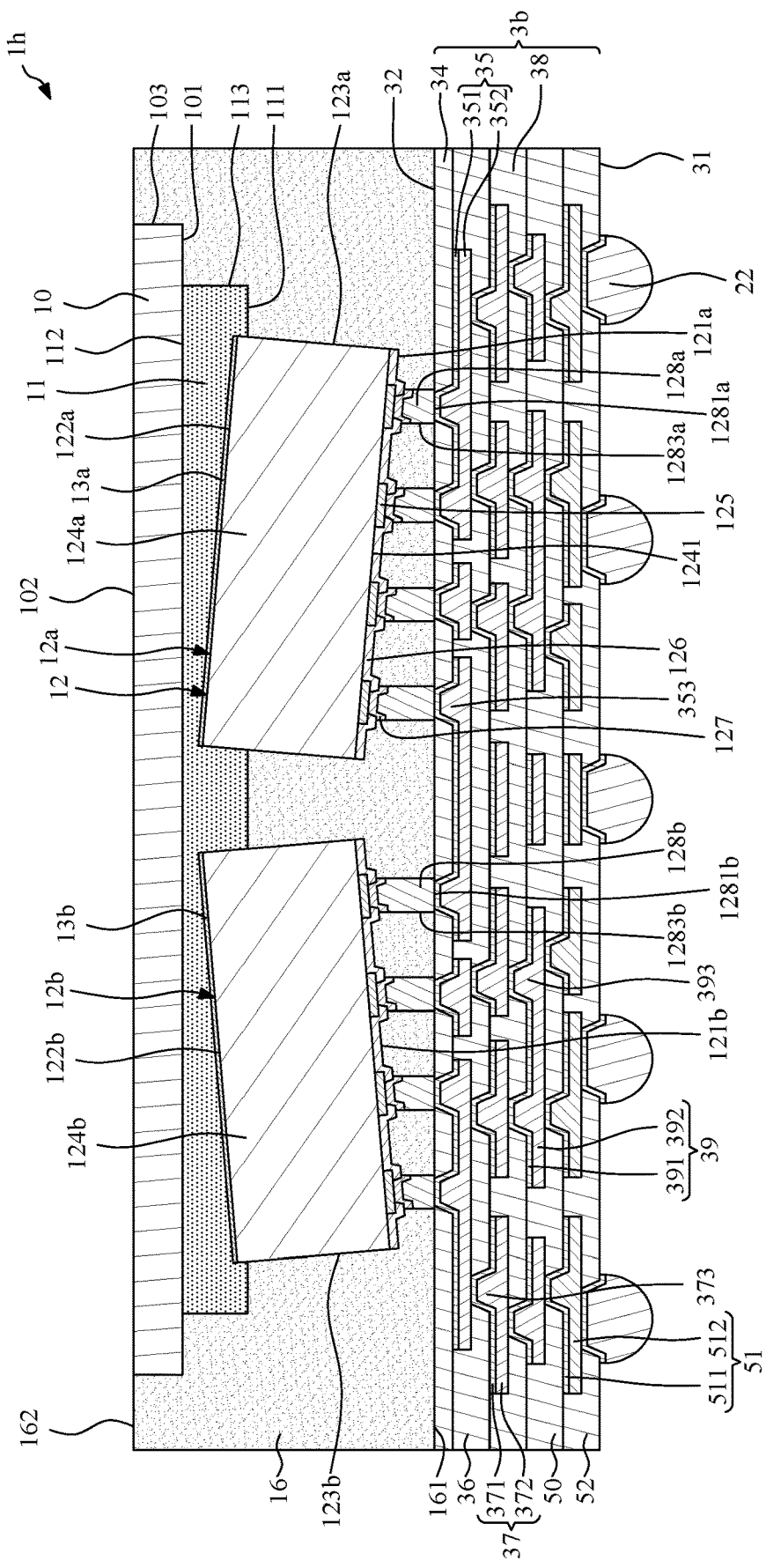
FIG. 18 illustrates a cross-sectional view of a package structure according to some embodiments of the present disclosure.

FIG. 18 illustrates a cross-sectional view of a package structure 1h according to some embodiments of the present disclosure. The package structure 1h of FIG. 18 is similar to the package structure 1f of FIG. 16 except that the first electronic device 12a and/or the second electronic device 12b may tilt or rotate. Thus, the second surface 122b of the second electronic device 12b may not be coplanar or parallel with the second surface 122a of the first electronic device 12a. In addition, the second surface 122b of the second electronic device 12b and/or the second surface 122a of the first electronic device 12a may not be parallel with the first surface 101 of the heat spreader 10. The lengths of the first electrical contacts 128a of the first electronic device 12a may be different from each other. The lengths of second electrical contacts 128b of the second electronic device 12b may be different from each other.

Figure 19:
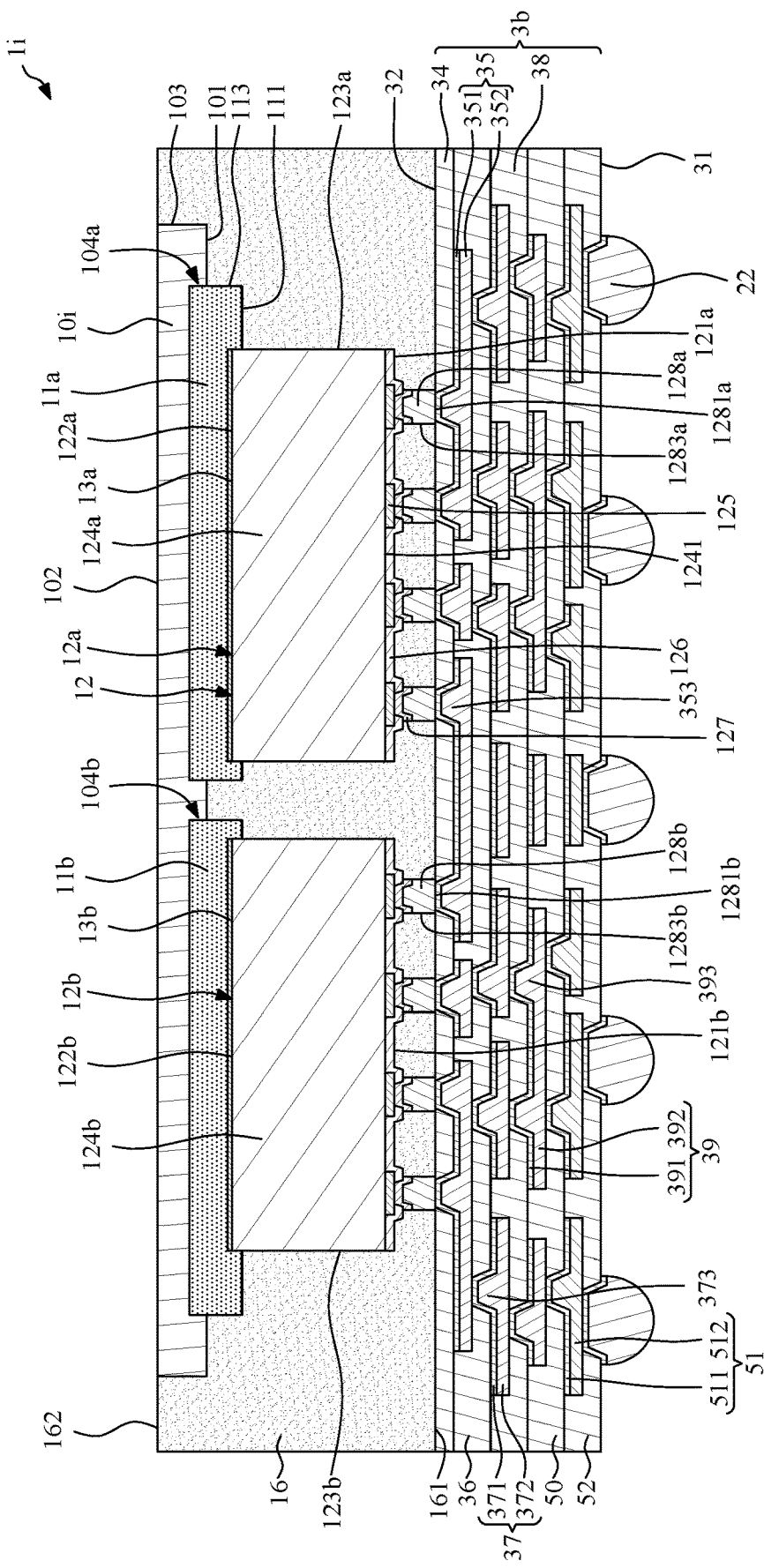
FIG. 19 illustrates a cross-sectional view of a package structure according to some embodiments of the present disclosure.

FIG. 19 illustrates a cross-sectional view of a package structure 1i according to some embodiments of the present disclosure. The package structure 1i of FIG. 19 is similar to the package structure 1b of FIG. 3 except that the heat spreader 10i further defines a first cavity 104a and a second cavity 104b recessed from the first surface 101 of the heat spreader 10i. A first intermediate layer 11a may be disposed in the first cavity 104a. The first electronic device 12a with the first bonding promoter 13a may be attached or fastened to the heat spreader 10i through the first intermediate layer 11a in the first cavity 104a. A width of the first electronic device 12a may be less than a width of the first cavity 104a. In addition, a second intermediate layer 11b may be disposed in the second cavity 104b. The second electronic device 12b with the second bonding promoter 13b may be attached or fastened to the heat spreader 10i through the second intermediate layer 11b in the second cavity 104b. A width of the second electronic device 12b may be less than a width of the second cavity 104b.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. A package structure, comprising:
an electronic device;
a heat spreader;
an intermediate layer interposed between the electronic device and the heat spreader, wherein the intermediate layer includes a sintered material, wherein the intermediate layer is a thermal interface material; and an encapsulant encapsulating the electronic device, wherein the electronic device includes a plurality of electrical contacts, and a surface of the encapsulant is substantially coplanar with a plurality of surfaces of the electrical contacts.

2. The package structure of claim 1, further comprising a bonding promoter interposed between the electronic device and the intermediate layer.

3. The package structure of claim 2, further comprising a plurality of intermetallic compounds (IMCs) disposed at an interface between the bonding promoter and the intermediate material, wherein the intermediate layer includes a plurality of metal particles and the bonding promoter comprises a metal layer.

4. The package structure of claim 1, wherein the encapsulant encapsulates the intermediate layer.

5. The package structure of claim 1, wherein the electrical contacts include bumps or pillars.

6. The package structure of claim 1, wherein a Young's modulus of the intermediate layer is greater than 0.3 GPa.

7. The package structure of claim 1, wherein a thermal conductivity of the intermediate layer is greater than 10 W/K.

8. A package structure, comprising:
an electronic device;
a heat spreader;
an intermediate layer interposed between the electronic device and the heat spreader, wherein the intermediate layer includes a sintered material; and
an encapsulant encapsulating the electronic device, wherein a portion of the electronic device is embedded in the intermediate layer.

9. The package structure of claim 8, wherein a portion of the intermediate layer is in contact with a portion of a lateral side surface of the electronic device.

10. A package structure, comprising:
a first electronic device;
a second electronic device;
a reinforcement layer 11 covering the first electronic device, the second electronic device and a gap between the first electronic device and the second electronic device, wherein the reinforcement layer includes a sintered material; and
a wiring structure electrically connected to the first electronic device and the second electronic device.

11. The package structure of claim 10, further comprising a heat spreader, wherein the reinforcement layer is attached to the heat spreader.

12. The package structure of claim 10, wherein the reinforcement layer includes a thermal interface material and is in contact with the first electronic device and the second electronic device.

13. The package structure of claim 12, wherein the reinforcement layer is in contact with a portion of a lateral side surface of the first electronic device and a portion of a lateral side surface of the second electronic device.

14. The package structure of claim 10, further comprising an encapsulant encapsulating the first electronic device and the second electronic device, wherein the first electronic device includes a plurality of first electrical contacts, the second electronic device includes a plurality of second electrical contacts, and a surface of the encapsulant is substantially coplanar with a plurality of surfaces of the first electrical contacts and a plurality of surfaces of the second electrical contacts.

* * * * *